(12) United States Patent
Suri et al.

(10) Patent No.: US 7,020,314 B1
(45) Date of Patent: Mar. 28, 2006

(54) BLACK BLOOD ANGIOGRAPHY METHOD AND APPARATUS

(75) Inventors: Jasjit S. Suri, Highland Heights, OH (US); Kecheng Liu, Solon, OH (US)

(73) Assignee: Koninklijke Philips Electronics N.V., Eindhoven (NL)

(*) Notice: Subject to any disclaimer, the term of this patent is extended or adjusted under 35 U.S.C. 154(b) by 770 days.

(21) Appl. No.: 10/011,037

(22) Filed: Nov. 13, 2001

(51) Int. Cl.
*G06K 9/00* (2006.01)

(52) U.S. Cl. .................. 382/130; 382/274; 382/169

(58) Field of Classification Search ............. 382/130, 382/131, 169, 171, 274, 272, 168, 128; 600/425, 600/407, 408; 128/922
See application file for complete search history.

(56) References Cited

U.S. PATENT DOCUMENTS

| | | | | |
|---|---|---|---|---|
| 5,560,360 | A | * | 10/1996 | Filler et al. ............... 600/408 |
| 5,699,799 | A | * | 12/1997 | Xu et al. .................... 600/407 |
| 5,768,405 | A | * | 6/1998 | Makram-Ebeid ........... 382/128 |
| 6,249,693 | B1 | * | 6/2001 | Cline et al. ................ 600/410 |
| 6,340,887 | B1 | | 1/2002 | Liu et al. ................... 324/309 |
| 6,366,800 | B1 | * | 4/2002 | Vining et al. .............. 600/425 |

(Continued)

FOREIGN PATENT DOCUMENTS

| | | |
|---|---|---|
| EP | EP0 542414 A1 | 5/1993 |
| EP | EP0 583104 A1 | 2/1994 |
| EP | EP1 087235 A1 | 3/2001 |

OTHER PUBLICATIONS

Krissian, et al., "Model-Based Multiscale Detection of 3D Vessels", Biomedical Image Analysis, 1998, Proceedings Workshop on Santa Barbara, CA Jun. 26-27, 1998, Los Alamitos, CA IEEE Comput. Soc. US Jun. 26, 1998 pp 202-210.
Apicella, et al., "Segmentation of Ventricles In Short Axis NMR Black Blood Images", Eng. in Medicine & Biology Society 1991, V. 13, 1991, Proceed. of Annual Int'l Conf. of IEEE, Orlando, FL Oct. 31, - Nov. 3, 1991, pp. 99-100.
Suri, et al, "Automatic Local Effect of Window/level on 3D Scale-Space Ellipsoidal Filtering on Run-Off-Arteries From White Blood Magnetic Resonance Angiography", Proc. 16th Int'l. Conf. on Pattern Recognition, Quebec City, QUE, CA, Aug. 11-15, 2002, pp. 899-902, vol. 3, XP002233463 2002 Los Alamitos, CA US IEEE Comput. Soc.

*Primary Examiner*—Barry Choobin
(74) *Attorney, Agent, or Firm*—Fay, Sharpe, Fagan, Minnich & McKee

(57) ABSTRACT

To produce a black body angiographic image representation of a subject (42), an imaging scanner (10) acquires imaging data that includes black blood vascular contrast. A reconstruction processor (38) reconstructs a gray scale image representation (100) from the imaging data. A post-acquisition processor (46) transforms (130) the image representation (100) into a pre-processed image representation (132). The processor (46) assigns (134) each image element into one of a plurality of classes including a black class corresponding to imaged vascular structures, bone, and air, and a gray class corresponding to other non-vascular tissues. The processor (46) averages (320) intensities of the image elements of the gray class to obtain a mean gray intensity value (322), and replaces (328) the values of image elements comprising non-vascular structures of the black class with the mean gray intensity value.

38 Claims, 33 Drawing Sheets

U.S. PATENT DOCUMENTS

| | | |
|---|---|---|
| 6,385,332 B1 * | 5/2002 | Zahalka et al. ............. 382/128 |
| 6,397,096 B1 | 5/2002 | Liu et al. .................... 600/419 |
| 6,438,403 B1 * | 8/2002 | Cline et al. ................. 600/410 |
| 6,690,816 B1 * | 2/2004 | Aylward et al. ............ 382/128 |
| 6,842,638 B1 * | 1/2005 | Suri et al. ................... 600/425 |
| 2002/0136440 A1 * | 9/2002 | Yim et al. .................. 382/131 |
| 2003/0031351 A1 * | 2/2003 | Yim ............................ 382/130 |
| 2003/0076987 A1 * | 4/2003 | Wilson et al. .............. 382/128 |

* cited by examiner

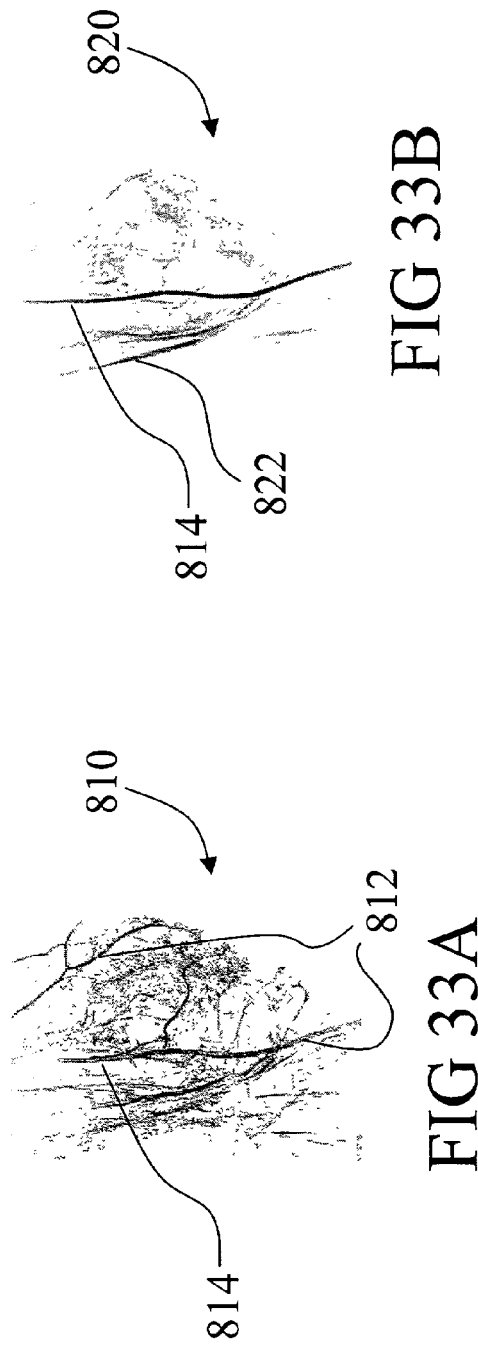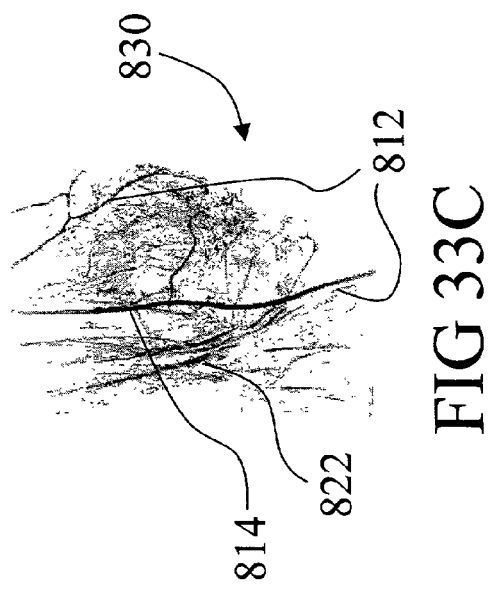
FIG 33A
FIG 33B
FIG 33C

BLACK BLOOD ANGIOGRAPHY METHOD AND APPARATUS

BACKGROUND OF THE INVENTION

The present invention relates to the medical imaging arts. It particularly relates to black-blood angiography (BBA) using the magnetic resonance imaging (MRI) and computed tomography (CT) medical imaging techniques, and will be described with particular reference thereto. However, the invention will also find application in conjunction with other three-dimensional imaging modalities as well as in other imaging arts in which structures or networks with well-defined characteristics are advantageously differentiated from extraneous imaged structures and background noise.

Catastrophic medical events such as heart attacks and strokes that result from underlying vascular problems are a leading cause of death in the United States. Many Americans also suffer from chronic vascular diseases which degrade quality of life.

Angiography relates to the imaging of blood vessels and blood vessel systems, and as such is a powerful medical diagnostic for identifying and tracking vascular diseases. Angiography enables improved surgical planning and treatment, improved diagnosis and convenient non-invasive monitoring of chronic vascular diseases, and can provide an early warning of potentially fatal conditions such as aneurysms and blood clots.

Angiography is performed using a number of different medical imaging modalities, including biplane X-ray/DSA, magnetic resonance (MR), computed tomography (CT), ultrasound, and various combinations of these techniques. Two-dimensional or three-dimensional angiographic data can be acquired depending upon the medical imaging modality and the selected operating parameters. Many angiographic techniques employ invasive contrast enhanced methodologies in which a contrast agent that accentuates the vascular image contrast is administered to the patient prior to the imaging session. Some techniques, such as MR imaging, are also capable of providing vascular contrast using non-invasive approaches that take advantage of intrinsic aspects of the vascular system, such as the blood motion or flow, to enhance the vascular contrast without an administered contrast agent.

Angiography can generally be categorized into two classes: white blood angiography (WBA) and black blood angiography (BBA). In WBA, the blood vessels (or the blood flowing therein) typically produces a higher image signal than the surrounding non-vascular tissues. For WBA methods such as time of flight MR (TOF-MR) imaging which rely on blood flow velocity to produce the signal enhancement, the WBA typically does not image the full blood vessel lumen. Because blood flow velocity is reduced near the vessel walls, the imaged WBA vessel is often narrower than the physical vessel lumen. Inaccurate WBA lumen imaging is particularly problematic from a clinical perspective because many vascular diseases involve blood vessel stenosis resulting from coating or other degradation of the inside vessel walls. Medical personnel are thus left to interpret whether an imaged blood vessel is exhibiting actual stenosis or simply has been inaccurately imaged by the WBA.

In contrast, BBA shows the vascular regions as signal voids. BBA is capable of more accurately imaging the blood vessel lumens as compared with WBA. BBA is also less sensitive to complex and non-uniform blood flow patterns. However, BBA suffers from several disadvantages relating to the post-acquisition image processing. Blood vessel segmentation of BBA images is complicated because the arterial and venous vascular systems are imaged simultaneously and because, in addition to the vascular structures, other non-vascular regions such as air pockets and bone surfaces typically also appear with dark contrast in the BBA images. These non-vascular dark regions obscure the BBA-imaged vascular structures, especially in minimum intensity projections (MIP's).

Past vessel segmentation methods have proven unsatisfactory for overcoming the problems and generating unambiguous angiographic images from acquired BBA data. The present invention contemplates an improved BBA method and apparatus which overcomes the aforementioned limitations and others.

SUMMARY OF THE INVENTION

According to one aspect of the invention, a post-acquisition method for processing a three-dimensional black blood angiographic image is disclosed. The image is comprised of voxels, each having an intensity value. The image includes both vascular and non-vascular structures or regions. Each voxel is assigned a class corresponding to one of a vessel/air/bone voxel class and a tissue voxel class. The intensity values of the voxels assigned to the tissue voxel class are averaged to obtain an average intensity value. Structures comprised of voxels assigned to the vessel/air/bone voxel class are identified which comply with at least one of selected size and shape characteristics. The voxels corresponding to the identified structures are replaced with the average intensity value.

According to another aspect of the invention, a method is disclosed for processing a black blood angiographic image. The image has an intermediate intensity background with low intensity structures corresponding to vascular and non-vascular structures imaged thereon. An average background intensity is identified for the intermediate intensity background. At least one low intensity non-vascular structure is identified. The intensity of the at least one low intensity non-vascular structure is replaced with the average background intensity to generate a vessels image.

According to another aspect of the invention, a method of diagnostic imaging is disclosed. A diagnostic image representation is generated, in which image elements corresponding to a first class are in a first characteristic value range and elements corresponding to a second class are in a second characteristic value range. Elements corresponding to at least one member of the first class are identified by at least one of shape and size characteristics. The identified elements are changed from the first characteristic value range to the second characteristic value range.

According to another aspect of the invention, an apparatus for producing a black body angiographic image representation of a subject is disclosed. An imaging scanner acquires imaging data from at least a portion of a subject, wherein the imaging data includes black blood vascular contrast effectuated by at least one of an associated contrast agent administered to the subject and an operative imaging modality of the imaging scanner. A reconstruction processor reconstructs an image representation from the imaging data. The image representation includes a plurality of gray scale image elements and exhibits black blood vascular contrast. A post-acquisition processor transforms the image representation into a pre-processed image representation, assigns each image element into one of a plurality of classes including a black class corresponding at least to imaged vascular structures and a gray class corresponding to at least some non-vascular tissues, averages intensities of the image elements of the gray class to obtain a mean gray intensity value, and replaces the values of image elements comprising non-vascular structures of the black class with the mean gray intensity value.

According to yet another aspect of the invention, a method for analyzing black blood angiographic gray scale data is disclosed. A black blood intensity range is identified that corresponds to vasculature and non-vascular structures. A gray intensity is identified that corresponds to at least some non-vascular tissue. Non-vascular structures having intensities in the black blood intensity range are replaced with the gray intensity to generate a vessels image in which the black blood intensity range corresponds to vasculature.

According to still yet another aspect of the invention, a diagnostic imaging apparatus is disclosed. A means is provided for generating a black blood angiographic image representation in which image elements corresponding to a first class are in a first characteristic value range and image elements corresponding to a second class are in a second characteristic value range. A means is provided for identifying at least one image structure formed of image elements of the first class by at least one of shape and size characteristics of the at least one image structure. A means is provided for changing the image elements forming the at least one image structure from the first value range to the second value range.

One advantage of the present invention is that it enables automated vessel segmentation of black blood angiographic images.

Another advantage of the present invention is that it removes interfering non-vascular structures having intensities that are similar to the black blood intensity from the black blood image.

Yet another advantage of the present invention is that it substantially removes non-vascular contrast from a black blood angiographic image to facilitate better visualization of the vascular system using three dimensional, two dimensional, and projection image representations.

Still yet another advantage of the present invention is that it advantageously retains the sharp vascular edges and accurate vessel lumen information typically achieved by black blood data acquisition during the vessel segmentation processing.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

FIG. 33A shows a representative sagittal projection image of a BBA image which has been segmented in accordance with an embodiment of the invention wherein the segmentation was performed for a minimum vessel width;

FIG. 33B shows a representative sagittal projection image of a BBA image which has been segmented in accordance with an embodiment of the invention wherein the segmentation was performed for a maximum vessel width; and FIG. 33C shows a composite projection image which combines the images of FIGS. 33A and 33B.

DETAILED DESCRIPTION OF THE PREFERRED EMBODIMENTS

Figure 1:
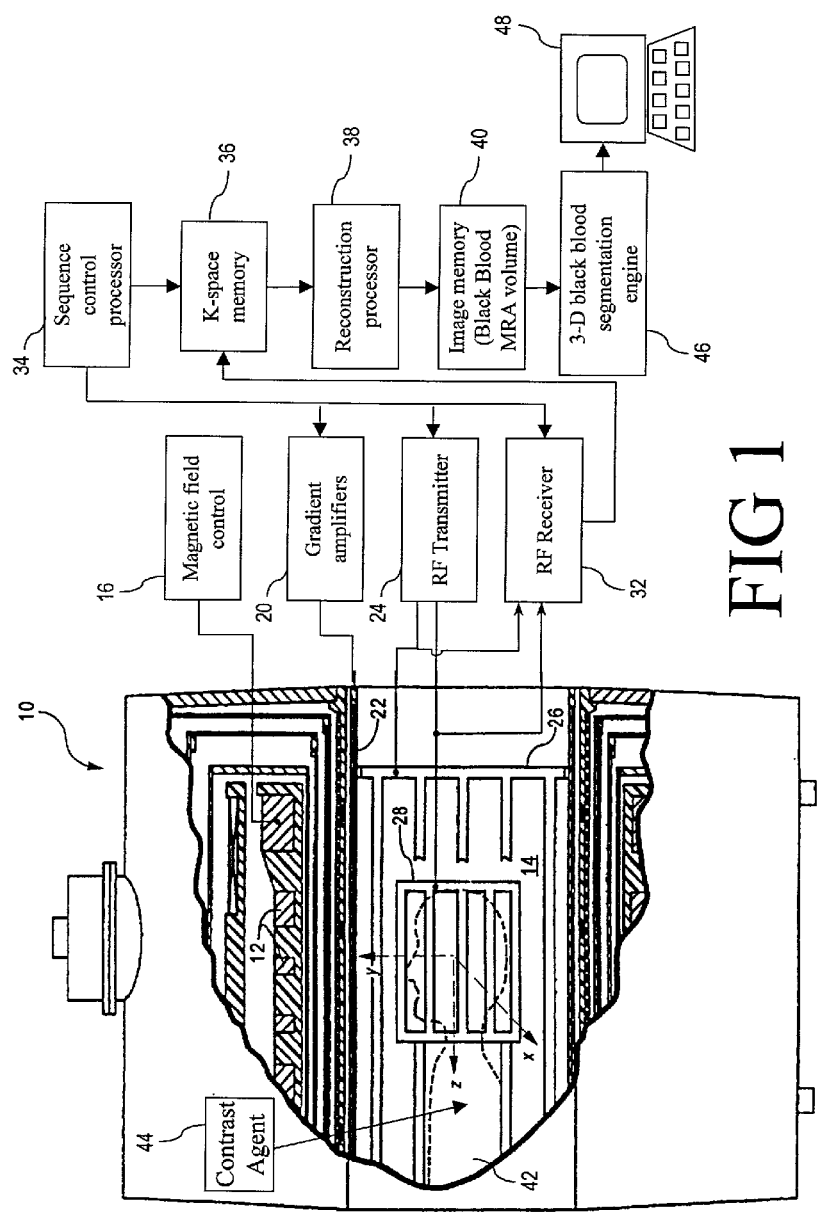
FIG. 1 shows an exemplary magnetic resonance angiography apparatus that suitably practices an embodiment of the invention.

With reference to FIG. 1, a magnetic resonance imaging system that suitably practices black blood angiographic (BBA) imaging in accordance with an embodiment of the invention is described. Although the invention is described herein with respect to a magnetic resonance imaging embodiment, those skilled in the art will appreciate that the invention is applicable to a broad range of angiographic modalities and techniques in which the angiographic image is of the black blood type. These modalities include but are not limited to contrast-enhanced magnetic resonance angiography, non-contrast enhanced magnetic resonance angiography, and computed tomographic angiography.

With reference to FIG. 1, a magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 1, the present invention is equally applicable to open magnet systems and other known types of MRI scanners. The magnets 12 are operated by a main magnetic field control 16. Imaging is conducted by executing a magnetic resonance (MR) sequence with the subject being imaged, e.g. a patient 42 in a magnetic resonance angiography (MRA) session, placed at least partially within the examination region 14, typically with the region of interest at the isocenter.

The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region.

For whole-body applications, the resulting resonance signals, generated as a result of a selected manipulation, are also picked up by the whole-body RF coil 26. Alternately, for generating RF pulses in limited regions of the subject, local RF coils are placed contiguous to the selected region. For example, as is known in the art, an insertable head coil 28 is inserted surrounding a selected brain region at the isocenter of the bore. Other surface coils or other such specialized RF coils may also be employed. For example, the RF system optionally includes a phased array receive coil (not shown) whereby partial parallel imaging (PPI) techniques known to the art are enabled. Preferably, the whole-body RF coil 26 induces resonance and the local RF coil or coil array receives magnetic resonance signals emanating from the selected region. In other embodiments, the local RF coil both excites and receives the resulting magnetic resonance signals.

Regardless of the RF coil configuration and the application thereof, the resultant RF magnetic resonance signals that are picked up by one or another of the RF coils is received and demodulated by an RF receiver 32. A sequence control processor 34 controls the gradient pulse amplifiers 20, the RF transmitter 24, and the RF receiver 32 to produce integrated MRI pulse sequence and readout waveforms that generate the magnetic resonance (MR) signals and optional echoes, provide appropriate encoding gradients to spatially encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26, 28 result in magnetic resonance echoes that map into k-space. The resultant magnetic resonance data is stored in a k-space memory 36. The k-space data is processed by a reconstruction processor 38, which is typically an inverse Fourier transform processor or other reconstruction processor known to the art, to produce a reconstructed image representation that is stored in an image memory 40.

In BBA, a patient 42 is imaged by the MRI system 10 using imaging conditions that provide a dark, low intensity signal for the vascular regions which particularly emphasizes the vascular system in the resultant image. In the exemplary FIG. 1, the carotid area of the patient 42 is imaged. Optionally, the patient receives a magnetic resonance contrast agent 44 to improve the vascular contrast, e.g. contrast-enhanced MRA is performed. A BBA sequence such as a gradient recalled sequence can be used in combination with large bipolar gradients or pre-saturation RF pulses. Another BBA sequence employs a spin-echo (SE) type sequence which utilizes wash-out effects. Under this sequence, flowing spins absorb very little of the excitation and refocusing RF pulses and thus contribute little or no signal to the reconstructed images. In this SE BBA sequence style large bipolar gradients or pre-saturation RF pulses are not needed. The selected BBA sequence is applied by the sequence control processor 34 and effectuates acquisition of the BBA MRA data.

Regardless of the choice of MRA imaging modality, the k-space data is collected in the k-space memory 36 and reconstructed by the reconstruction processor 38 to generate the MRA volume image data 40. The MRA volume image data is in the form of a three-dimensional gray scale image representation of the examined area of the patient, which has good contrast for the vascular system relative to other body tissues of the patient 42. Typically a three dimensional image data comprising multiple slices is acquired to provide volume imaging of the patient 42. However, it is also contemplated that only a single image slice is acquired in a patient imaging session.

A three-dimensional post-acquisition segmentation processor 46 processes the BBA volume image representation 40 to substantially remove the background noise and the non-vascular contrast, and to segment the vascular structure. The segmenting can be performed in several ways, including: identifying the vasculature as a set of voxels corresponding to the imaged vascular structures; separating of the vascular regions of the image from the non-vascular regions of the image; assigning a first value to voxels corresponding to imaged vascular structures, and a second value to voxels corresponding to imaged non-vascular structures; and removing contrast corresponding to non-vascular structures from the image.

The segmented vascular information is preferably graphically displayed on an appropriate user interface 48, typically as a two-dimensional or three-dimensional graphical image representation. The vascular information can of course also be stored electronically or on a magnetic storage medium, printed on paper, and et cetera (not shown).

Figure 2:
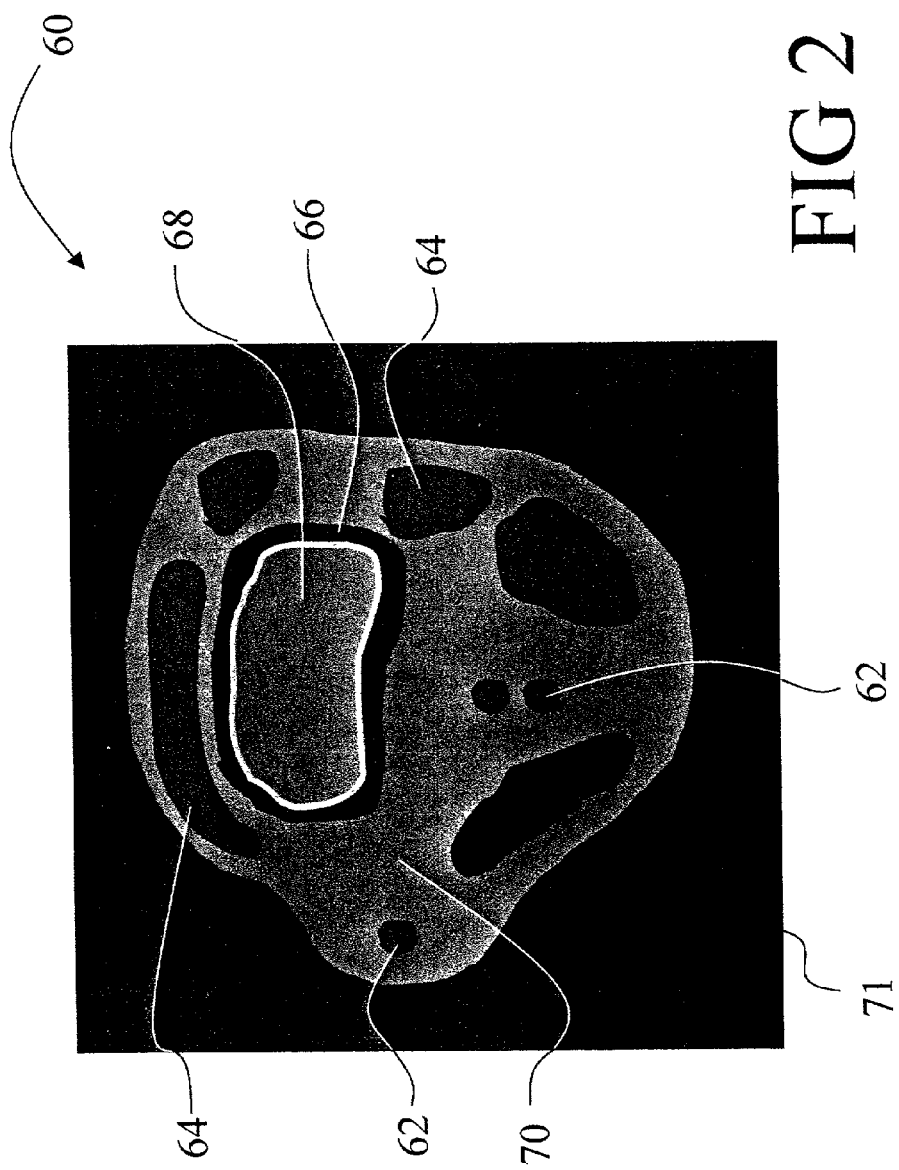
FIG. 2 shows a schematic representation of a typical black blood angiographic (BBA) image of a knee in the axial orientation.

With reference to FIG. 2, an exemplary schematic BBA axial image slice 60 of a knee region is shown. The schematic BBA image 60 selectively shows the vascular structures 62 as dark, typically almost totally black, low intensity regions of the image 60. However, the image 60 usually also includes some background noise (not shown) as well as additional undesirable very dark or black regions associated with non-vascular structures. Non-vascular structures which typically appear black in BBA images include air pockets 64 and regions 66 surrounding bone interior 68. The interior of the bones 68 along with most other anatomical structures typically image as dark gray, medium intensity regions that collectively form a dark gray background 70 in the image 60. The outer portions 71 of the image that lie outside the body are black since this is essentially air.

Thus, a typical BBA image 60 includes the desired black blood vessels 62 along with undesired non-vascular black structures 64, 66 of nearly the same intensity as the blood vessels 62 associated with air pockets and bone surfaces, respectively, on an otherwise relatively uniform dark gray background 70. The air pockets 64 are typically circular, oblong, or otherwise shaped, while the black regions 66 surrounding bone are usually annular.

Figure 3:
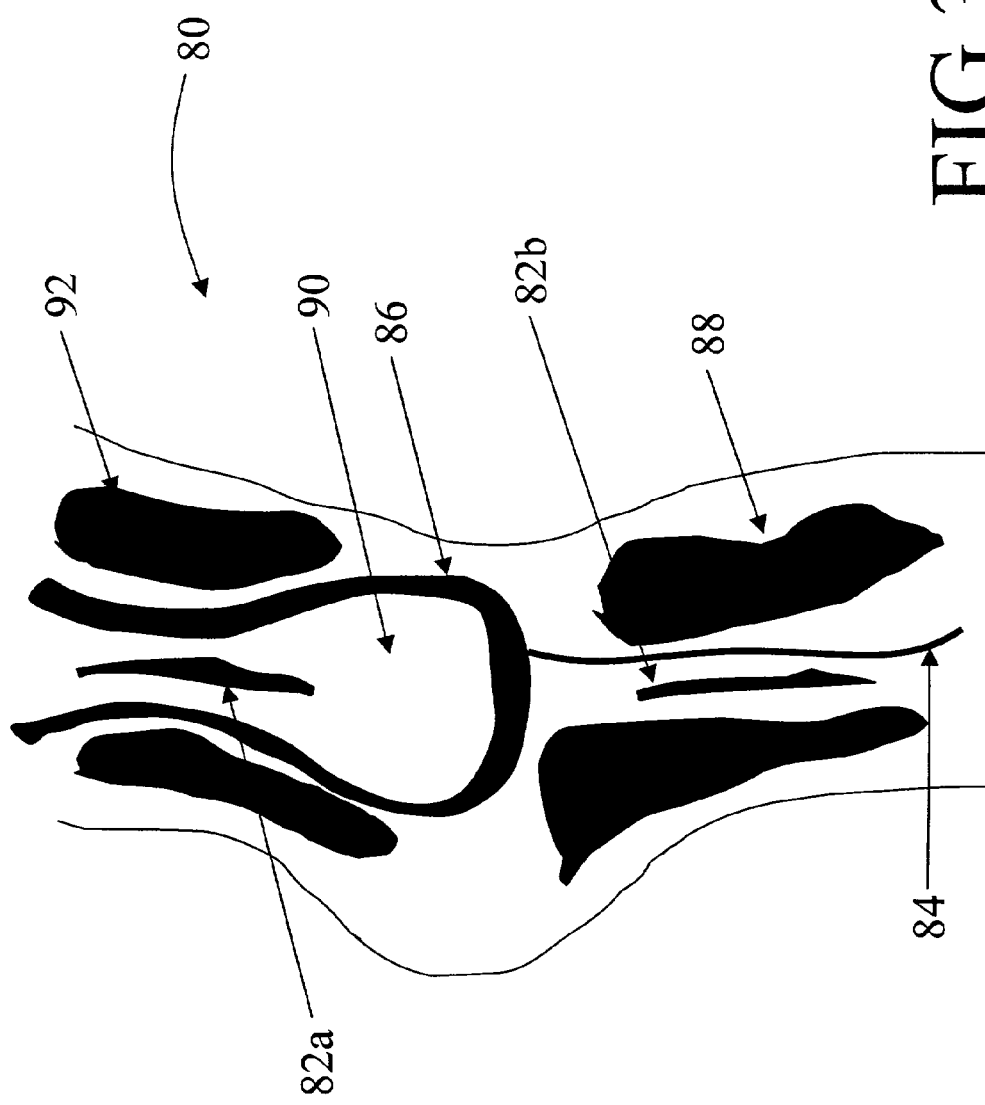
FIG. 3 shows a schematic representation of a typical black blood angiographic (BBA) image of a knee in the sagittal orientation.

With reference to FIG. 3, an exemplary schematic BBA sagittal image slice 80 of a knee region is shown. In this schematic image 80 vessels appear as tubular structures 82, 84 of varying diameter. It can be seen that at least the larger vessel 82 is imaged discontinuously with two parts 82a, 82b shown. The vessel portion 82a is also seen to have a varying diameter along its imaged length. As in the previous exemplary image, the bone lining is imaged black 86, as are air pockets 88, while the bone 90 itself is dark gray. Also, certain muscles are seen to be dark 92. It will be appreciated that the non-vascular black regions 86, 88, 92 can occlude the vessels from view in the image 80. Neighboring black non-vascular structures can also be difficult to differentiate from vascular structures.

Figure 4:
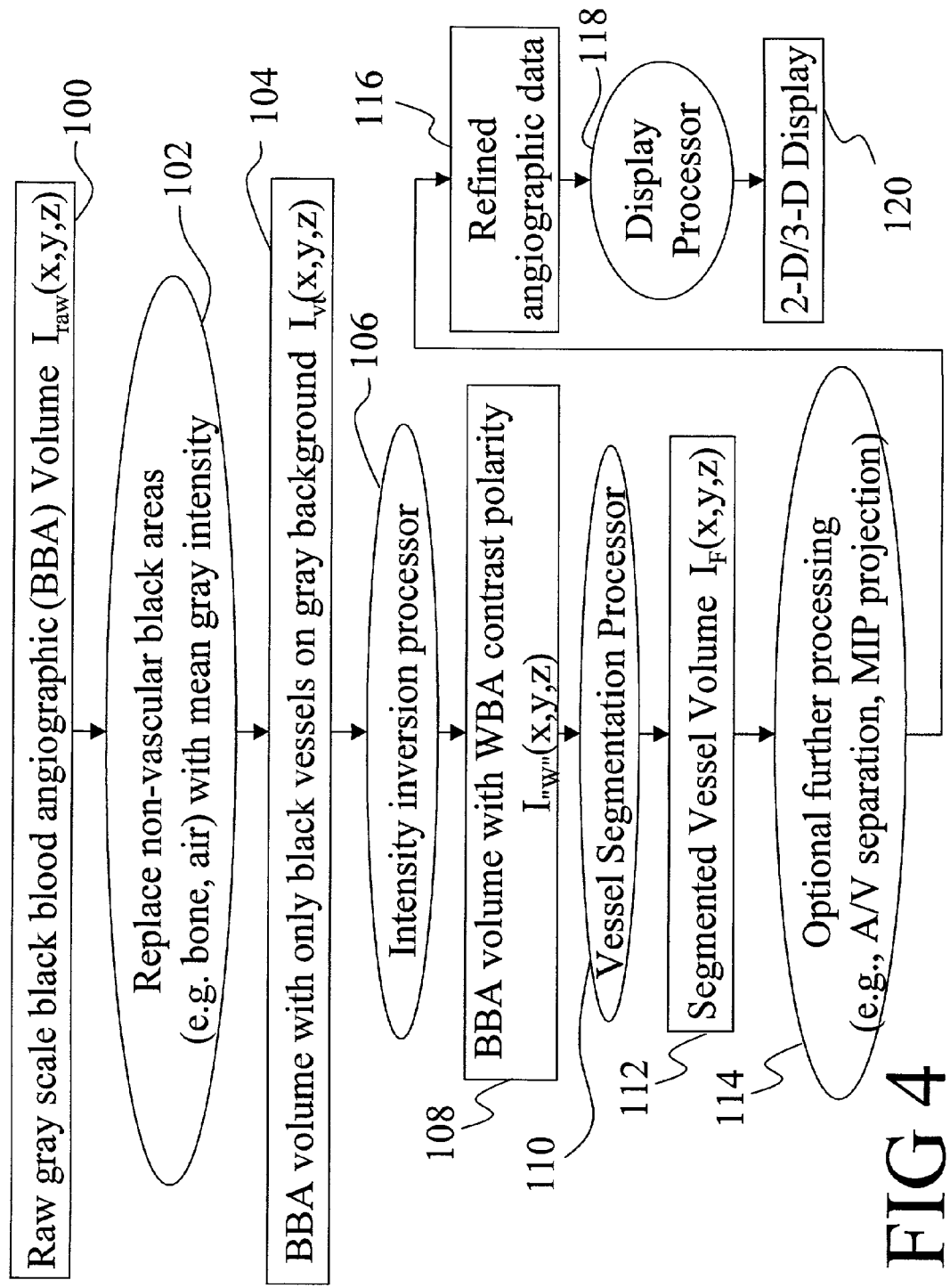
FIG. 4 shows a diagrammatic overview representation of a BBA post-acquisition processing method that suitably practices an embodiment of the invention.

With reference now to FIG. 4, an overview of a suitable embodiment of the BBA process is described. A raw gray scale BBA volume image $I_{raw}(x,y,z)$ 100 is obtained using computed tomography (CT), magnetic resonance imaging, or another imaging configured to acquire BBA volume data. The raw data 100 includes non-vascular black areas as well as the desired black blood vessels, on a typically gray higher intensity background.

The non-vascular black regions, e.g. due to bone linings, air pockets, or the like, are identified and replaced 102 with a gray intensity level. In a suitable embodiment, the replacing gray intensity level is the average gray level of the background, such as the gray background 70 of the exemplary image 60 of FIG. 2. In this way a new image $I_{vt}(x,y,z)$ 104 that contains only black vascular regions and gray tissue is generated.

The image $I_{vt}(x,y,z)$ 104 does not contain the interfering black non-vascular regions, and so is usable for vessel segmentation. However, most vessel segmentation methods have been developed for white blood angiography (WBA) and are designed to interpret high intensity, white areas as the vascular structures. The maximization operators, vessel connectivity analyses, statistical classifiers, and mathematical morphology processors used in vessel segmentation are optimized for the white blood intensity polarity in which vascular structures are imaged at high intensity. Thus, preparatory to vessel segmentation the vessel/tissue image $I_{vt}(x,y,z)$ 104 is advantageously intensity inverted 106 to produce an image $I_{-W-}(x,y,z)$ 108 that has a WBA-type image polarity. Those skilled in the art will recognize that although the image $I_{-W-}(x,y,z)$ 108 has the WBA polarity, it is nonetheless a BBA image and retains the advantages of black blood imaging, such as accurate vessel lumen imaging.

Having obtained an image $I_{-W-}(x,y,z)$ 108 with the desired "white blood" intensity polarity, a vessel segmentation processor 110 is employed to generate a segmented vessel volume $I_F(x,y,z)$ 112 which is denoised and unambiguously displays the vascular structures with substantially suppressed non-vascular contrast.

The segmented volume 112 can be further processed 114, e.g. employing artery-vein separation, MIP projections, or the like, to produce further-refined angiographic data 116. The image can be supplied, with or without the additional processing 114, to a display processor 118 to generate a two- or three-dimensional angiographic display 120.

Figure 5:
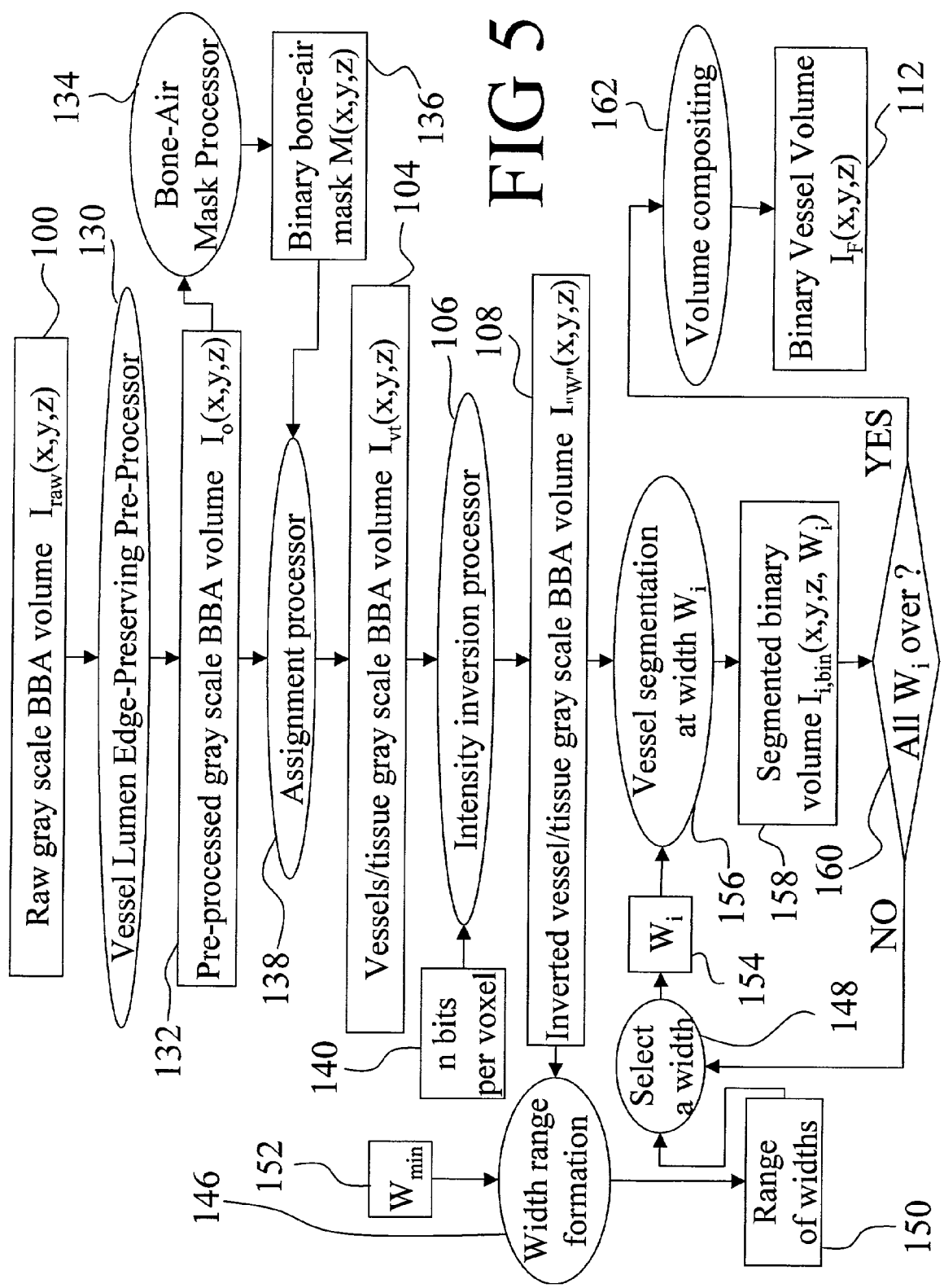
FIG. 5 shows a more detailed diagrammatic overview representation of a suitable embodiment of the vessel segmentation portion of the BBA post-acquisition processing method of FIG. 4.

With reference to FIG. 5, the method of FIG. 4 will be described in greater detail. The raw BBA data $I_{raw}(x,y,z)$ 100 is typically in the form of a machine-specific format which may include non-cubic voxel dimensions, variable sampling rates, or other undesirable aspects. The raw data 54 is therefore preferably pre-processed 130 to generate a pre-processed angiographic volume $I_o(x,y,z)$ 132 that conforms to a pre-selected or standardized image format. In the past, angiographic data pre-processing has included smoothing by convolution with a Gaussian smoothing function. However, Gaussian smoothing has the disadvantage of blurring edges. Since a major advantage of the BBA technique is accurate vessel lumen imaging, such blurring is highly undesirable for BBA images. Thus, a non-Gaussian vessel edge-preserving smoothing and pre-processing 130 is employed.

With continuing reference to FIG. 5, the pre-processed BBA data $I_o(x,y,z)$ 132 is processed to replace the non-vascular black regions with a gray scale, i.e. according to the step 102 of FIG. 4. The image $I_o(x,y,z)$ 132 is analyzed by a bone-air mask processor 134 to produce a binary bone-air mask $M(x,y,z)$ 136 that identifies the non-vascular black image structures. An assignment processor 138 replaces the identified non-vascular black structures with a gray intensity corresponding to the gray intensity of the imaged tissue to produce the image $I_{vt}(x,y,z)$ 104 that contains only black vascular regions and gray tissue.

The intensity inversion processor 106 inverts the intensities, i.e. converts "white" or high intensity to "black" or low intensity and vice versa, to produce the inverted image $I_{\sim W\sim}(x,y,z)$ 108. As is known to the art, intensity invertors typically receive as an input the number of bits per voxel (n) 140 which translates into the dynamic intensity range of the data. For example, where n=8 each voxel can have intensity values ranging from 0–255. More generally, for n bits per voxel, each voxel can have intensity values ranging from $0-2^{(n-1)}$.

The vessel segmentation processor 110 of FIG. 4 is implemented in FIG. 5 in the following way. A range of widths 150 is selected 146. A minimum width $W_{min}$ 152 is usually supplied based on the image resolution, or alternatively by a user input. A range of widths is selected 150 which spans the range from $W_{min}$ to a maximum width of the vessels imaged in the image $I_{\sim W\sim}(x,y,z)$ 108. For each selected 148 width $W_i$ 154 of the range 150, a vessel segmentation is performed 156 to generate a segmented binary volume $I_{i,bin}(x,y,z, W_i)$ 158 corresponding to the width $W_i$ 154. Since the width $W_i$ 154 is pre-defined, the segmentation 156 is mathematically simplified. The segmentation is repeated 160 for every width $W_i$ 154 in the range 150, and the resulting images $I_{i,bin}(x,y,z, W_i)$ 158 are composited 162 to form the final segmented vessel volume $I_F(x,y,z)$ 112 which in the illustrated embodiment of FIG. 5 is a binary volume.

Figure 6:
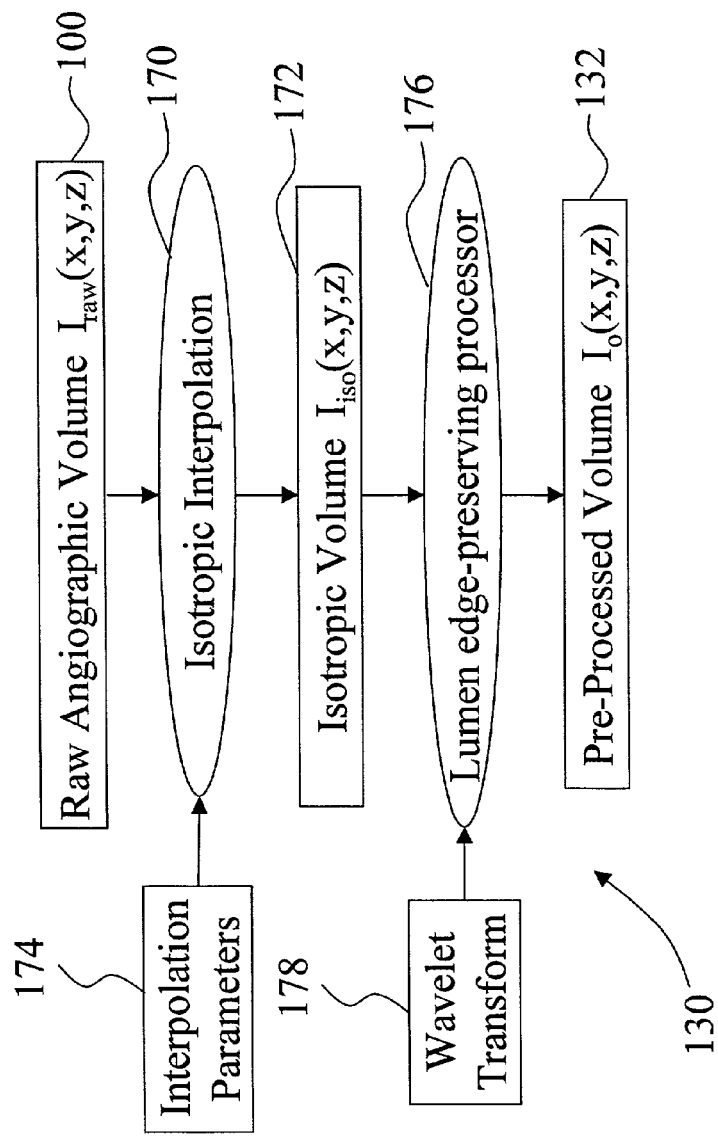
FIG. 6 shows a diagrammatic representation of a suitable embodiment of the pre-processor component of the processing method of FIG. 5.

With reference to FIG. 6, the vessel lumen edge-preserving pre-processor 130 is described. The illustrated pre-processor 130 includes an isotropic interpolation processor 170 that produces an isotropic volume $I_{iso}(x,y,z)$ 172. In a preferred embodiment, the isotropic interpolation employs a sinc function known to the art to substantially preserve high frequency image components, with input interpolation parameters 174 selected to convert the non-isotropic volume $I_{raw}(x,y,z)$ 100 into an isotropic volume $I_{iso}(x,y,z)$ 172. Of course, if the as-acquired volume $I_{raw}(x,y,z)$ 100 is isotropic, the interpolating 170 can be omitted.

The isotropic volume $I_{iso}(x,y,z)$ 172 is smoothed and optionally down-sized using an edge-preserving processor 176 which preferably employs a discrete wavelet transform (DWT) 178 for edge-preservation re-sizing. The DWT advantageously substantially preserves the high frequency edges of the image. This preservation is particularly important when processing BBA data, since a primary advantage of BBA is more accurate blood vessel lumen imaging as compared with WBA. The smoothed and optionally down-sized volume is the pre-processed image $I_o(x,y,z)$ 132.

Figure 7:
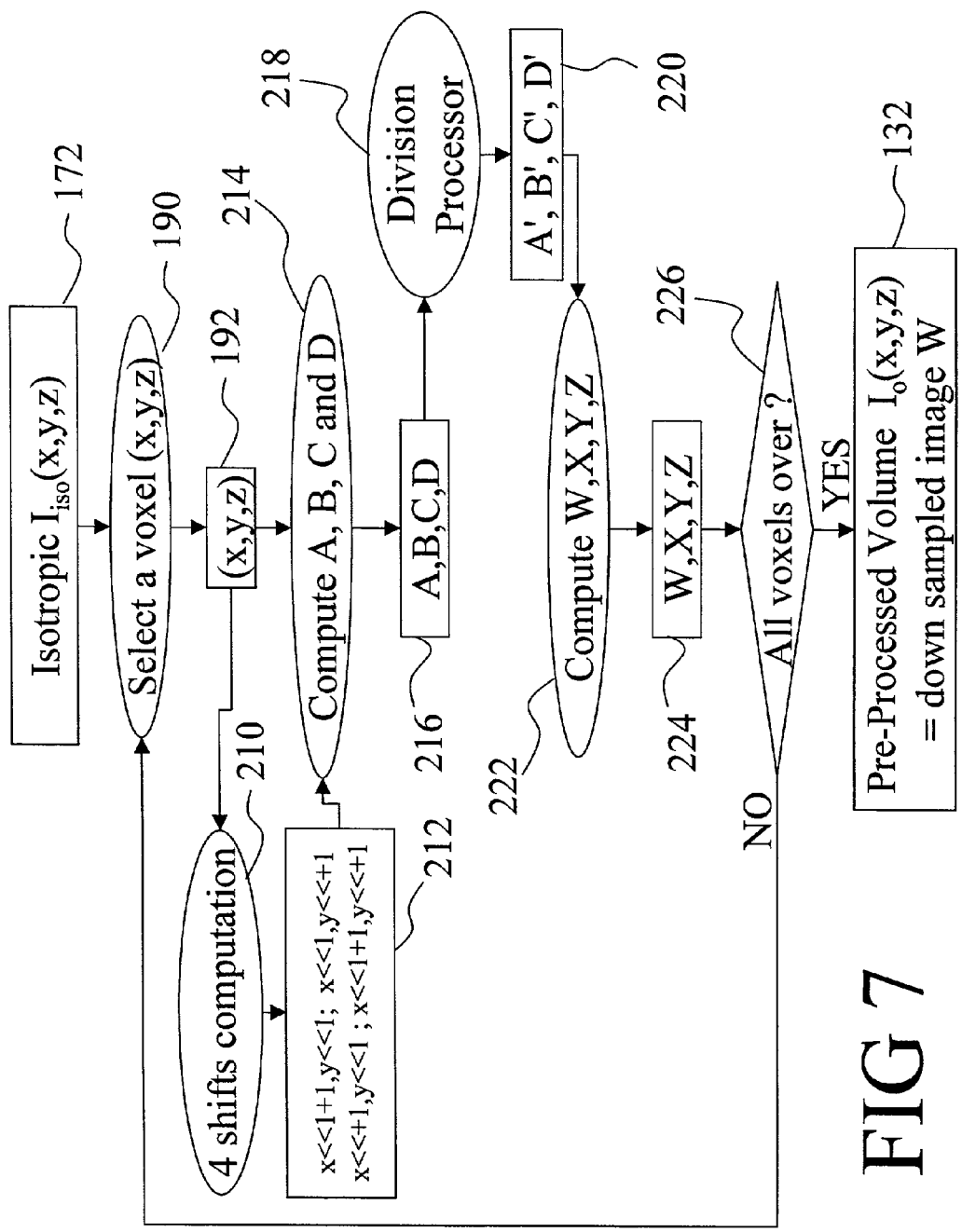
FIG. 7 shows a diagrammatic representation of a suitable embodiment of the down-sizing process using a discrete wavelet transform.

With reference to FIG. 7, a preferred embodiment of the lumen edge-preserving down-sampling 176 is described. A voxel $(x,y,z)$ 192 is selected 190 from the isotropic image volume $I_{iso}(x,y,z)$ 172. The wavelet transform is applied according to:

$$\Phi_{(a,b)}(x) = 2^{-\frac{1}{2}}\Phi\left(\frac{x-b}{a}\right) \quad (1)$$

where $\Phi$ is the image volume $I_{iso}(x,y,z)$ 172, a is a scale factor and b is a location/time parameter. The continuous wavelet transform is given by convolution as:

$$\tilde{f}_w(a, b) = \int_{-\infty}^{\infty} f(t) 2^{-\frac{1}{2}}\Phi\left(\frac{t-b}{a}\right). \quad (2)$$

The mother function $\Phi$, e.g. the image volume $I_{iso}(x,y,z)$ 172, should satisfy admissibility criterion to ensure that it is a localized zero-mean function. Equation (2) can be discretized by restraining a and b to a lattice of the form $a=2^{-s}$ to get a wavelet basis in which the dilations and translations (scaling and shifting) of the mother function $\Phi$ is given by:

$$\Phi_{(s,l)}(x) = 2^{-\frac{s}{2}}\Phi(2^{-s}x - l) \quad (3)$$

where s and l are integers that scale and dilate the mother function $\Phi$ to generate wavelets, such as those of the Daubechies wavelet family. The scale index s indicates the wavelet's width and the location index l gives its position. Those skilled in the art will recognize that by applying equation (3) to the isotropic image $I_{iso}(x,y,z)$ 172 the image is rescaled or dilated by powers of 2 and translated by integers.

Figure 8:
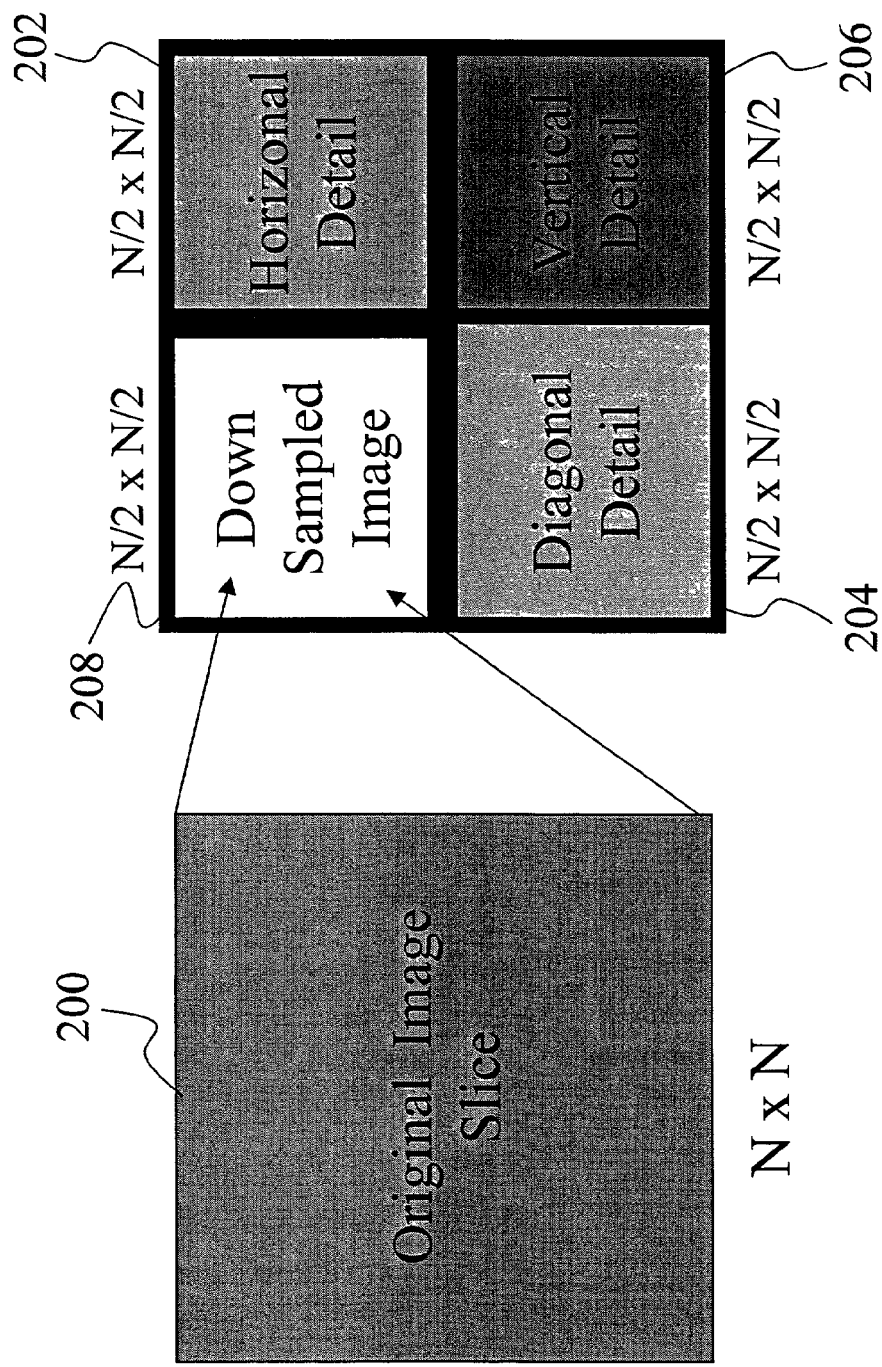
FIG. 8 shows a diagrammatic representation of the wavelet coefficient matrices produced by the discrete wavelet transform.

With reference to FIG. 8, an application of equation (3) in which the original image is down-sized by half while preserving the high frequency components is schematically diagrammed. As shown therein, the original N×N image 200 is transformed into four down-scaled images. three of these images, 202, 204, 206 contain horizontal, diagonal, and vertical details, respectively, while the fourth image 208 contains a down-scaled version of the original image 200.

Figure 9:
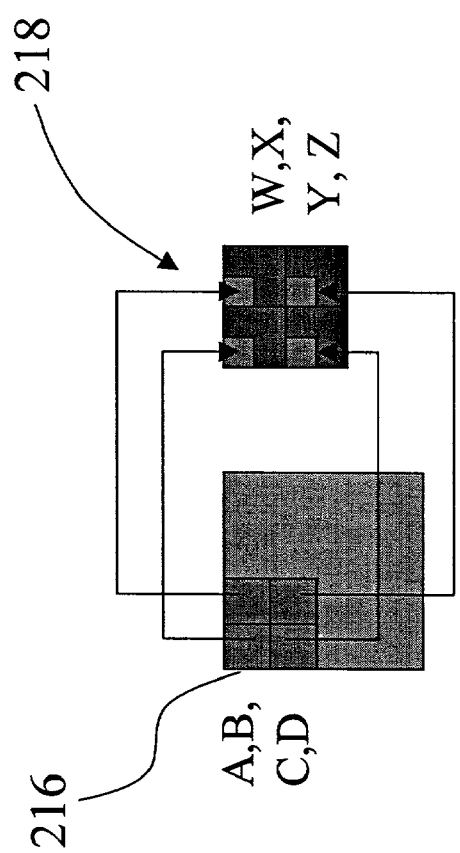
FIG. 9 shows a diagrammatic representation of the selection of the wavelet coefficient matrix as the down-sized image when down-sizing using the discrete wavelet transform.

With returning reference to FIG. 7, equation (3) is implemented 210 using four shift operations 212 and the coefficients A, B, C, D 216 are computed 214. The coefficients 216 are divided 218 to produce modified coefficients A', B', C', D' 220. The DWT transform coefficients W, X, Y, Z 224 are computed 222. With reference to FIGS. 8 and 9, it is seen that only the coefficient W corresponds to the down-sized image while the remaining coefficients x, Y, z contain edge information. Thus, after cycling 226 through all the image voxels, the pre-processed volume $I_o(x,y,z)$ 132 corresponds to the down-sampled image W.

With reference returning to FIG. 5, the pre-processed volume $I_o(x,y,z)$ 132 is processed to remove the non-vascular dark or black regions by constructing 134 a binary bone-air mask 136 and assigning a gray intensity level to the non-vascular black areas identified by the mask 136. This replacement process is next described.

Figure 10:
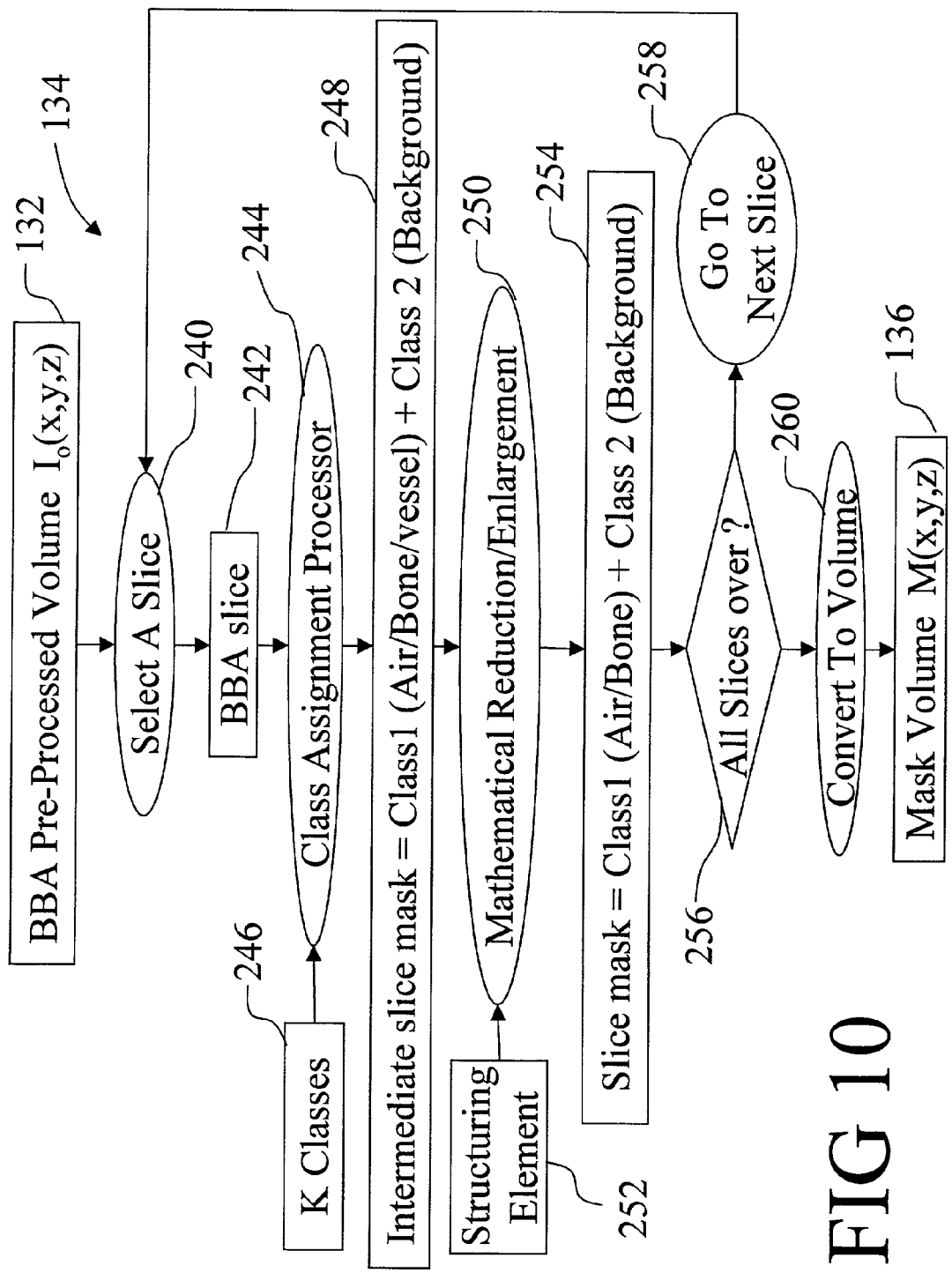
FIG. 10 shows a diagrammatic representation of a suitable embodiment of the bone/air mask generator of FIG. 5.

With reference to FIG. 10, an embodiment of the bone-air mask processor 134 is described. A slice selector 240 selects a slice 242 from the BBA pre-processed volume $I_o(x,y,z)$ 132. Each pixel in the slice 242 is classified 244. The number of classes 246, designated herein as K, corresponds to the number of distinct types of pixels in the slice 242. As described previously with reference to FIGS. 2 and 3, typical BBA images contain two types of pixels: (1) black pixels that correspond to vascular structures or to certain non-vascular structures such as air pockets and bone linings; and (2) gray pixels that correspond to most tissue types (e.g., muscle, organs, etc.) and form the overall image background. Thus, the number of classes 246 is selected as K=2.

The class assignment processor 244, a suitable embodiment of which will be described later, assigns each pixel of the slice 242 as either a black pixel or a gray pixel, corresponding to bone/air/vascular structures and tissue background respectively. The classification results are suitably expressed as an intermediate binary slice mask 248. The mask 248 is intermediate because it does not differentiate between vascular and non-vascular black pixels, whereas the desired mask should identify only the non-vascular black regions.

It will be appreciated that the vascular regions are tubular in structure, whereas non-vascular regions are typically large annular structures corresponding to bone linings or large irregular structures corresponding to air pockets. Thus, the mask processor 134 removes the vascular regions from the intermediate mask 248 using a mathematical reduction/enlargement sequence 250. In a suitable embodiment, an erosion process applies a structuring element 252 to erode the edges of the black regions of the mask by a pre-selected amount. The narrow tubular vascular structures are thus completely removed whereas the non-vascular structures, which are typically larger, have only the edges reduced. A subsequent dilation process enlarges the non-vascular areas back to their original uneroded size. The resulting slice mask 254 contains only the non-vascular structures with the blood vessels removed, and is suitable for use in identifying the non-vascular black regions of the image.

The slice mask generation process is repeated on a slice-by-slice basis 256, 258 to produce a mask slice 254 corresponding to each slice of the pre-processed volume 132. The mask slices 254 are combined 260 to generate a mask volume 136.

Figure 11:
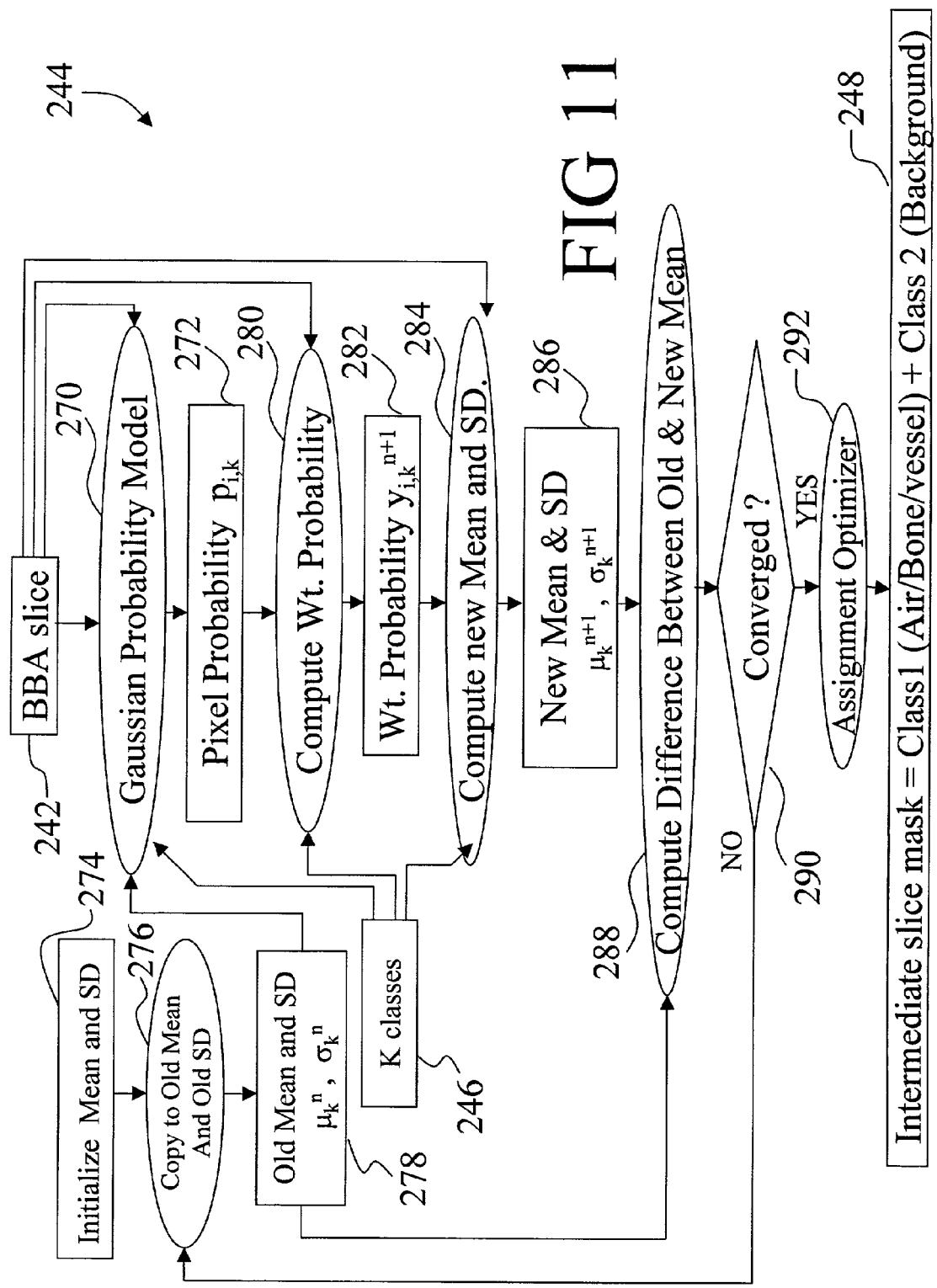
FIG. 11 shows a diagrammatic representation of a suitable embodiment of the class assignment processor of FIG. 10.

With continuing reference to FIG. 10 and with further reference to FIG. 11, a suitable embodiment of the class assignment processor 244 is described. The described processor 244 embodiment is based on constructing a parameterized statistical model including Gaussian distributions. For two-class BBA image slices Gaussian distributions are used. The mean and standard deviation of the Gaussian distribution are parameters which are optimized to produce optimally definitive class likelihoods for the image elements (e.g., pixels or voxels).

The class assignment processor 244 will be described with reference to N pixels in the image slice 242, and with respect to K classes 246. Although K=2 for typical two-class BBA data, inclusion of additional classes is also contemplated for specific imaging situations, and so the processor 244 is described for an arbitrary number of classes K. The pixels are designated herein by i where $1 \leq i \leq N$, and the classes are designated by k where $1 \leq k \leq K$. The pixel intensities are expressed herein as $x_i$. The pixel classifications are expressed as $y_{i,k}$, which indicates the statistical probability that the pixel i is a member of the class k. A Gaussian probability model 270 is used to calculate unweighted pixel probabilities 272 according to:

$$p_{i,k} = p(x_i | y_{i,k}, \Phi) = \frac{1}{\sqrt{(2\pi)^D \sigma_k^2}} e^{\frac{-(x_i - \mu_k)^2}{2\sigma_k^2}} \quad (4)$$

where: $P_{i,k} = p(x_i | y_i, \Phi)$ is the unweighted Bayesian probability that a pixel of intensity $x_i$ is in the class k; $\mu_k$ and $\sigma_k$ are the mean and standard deviation of the Gaussian probability distribution model; $\Phi$ are the model parameters, e.g. $\Phi = \{\mu_k, \sigma_k\}$; and D is a dimensional parameter, here D=1.

The described embodiment of the class assignment processor 244 optimizes the classification probabilities by maximizing the a posteriori probability by iteratively optimizing the Gaussian model parameters $\Phi = \{\mu_k, \sigma_k\}$ and a weighting $w_k$. The pixel classification values $y_{i,k}$ and the distribution parameters $\Phi = \{\mu_k, \sigma_k\}$ are assigned initial values 274, and an initial probability weighting $w_k$ is computed. Suitable initial values are given by:

$$w_k^o = \frac{1}{k}\xi \quad \mu_k^o = \frac{(k+1)2^N}{k} \quad \sigma_k^o = \sqrt{\frac{N}{2} \times \frac{N}{2}} = \frac{N}{2} \quad (5)$$

where $\xi$ is the covariance and the superscript "o" indicates the zeroth iteration. The initial mean and standard deviation 274 are copied 276 into the past-iteration or old mean and standard deviation memory 278. Using the Gaussian probability model 270, the unweighted pixel probability $p_{i,k}$ 272 is calculated using the old mean and standard deviation 278, and an updating of the weighted classification values $y_{i,k}^{n+1}$ is performed 280 according to:

$$y_{i,k}^{n+1} = \frac{p_{i,k}^n w_k^n}{\sum_k p_{i,k}^n w_k^n}, \quad (6)$$

where the superscript n indicates the current iteration, the superscript n+1 indicates the next iteration, and $w_k^n$ is a weighting given by:

$$w_k^n = \frac{\sum_i y_{i,k}^{n-1}}{\sum_k y_{i,k}^{n-1}}. \quad (7)$$

The updated classification probabilities $y_{i,k}^{n+1}$ 282, which are weighted probabilities, are thus obtained. An iterative updating of the statistical model parameters is also performed 284 according to:

$$\mu_k^{n+1} = \frac{\sum_i y_{i,k}^n x_i}{\sum_k y_{i,k}^n}, \quad \sigma_k^{n+1} = \sqrt{\frac{\sum_i y_{i,k}^n (x_i - \mu_k^n)^2}{\sum_k y_{i,k}^n}} \quad (8)$$

to generate updated statistical model parameters 286.

The iterative process is terminated using a suitable convergence criteria. For example, convergence can be indicated by computing 288 a difference between the old mean $\mu_k^n$ and the new mean $\mu_k^{n+1}$ for each class k and checking 290 for convergence by comparing the differences with pre-set criteria. The iterative process can also optionally be terminated after a pre-set number of iterations. Once the iterative process is complete, an assignment optimizer 292 assigns the optimized classification to each pixel of the intermediate slice mask 248 as described next.

Figure 12:
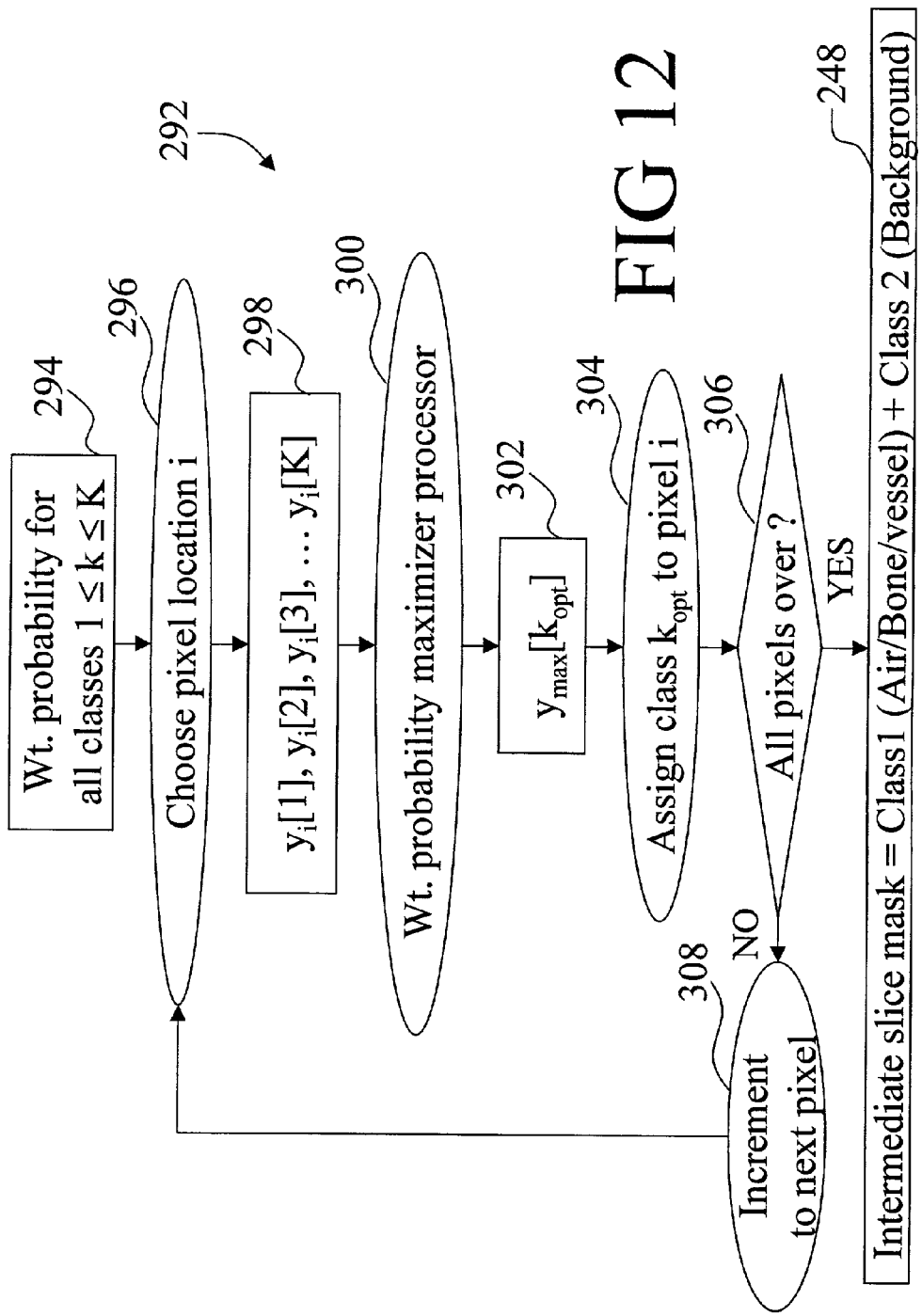
FIG. 12 shows a diagrammatic representation of a suitable embodiment of the assignment optimizer of FIG. 11.

With continuing reference to FIG. 11 and with further reference to FIG. 12, the assignment optimizer 292 is described. The final probability weights 294 are obtained according to equation (7). A pixel is selected 296 and the final weighted probabilities $y_{i,k}$ of each class for that pixel are obtained 298 according to equation (6). A weighted probability maximizer processor 300 selects the class k that has the highest corresponding weighted probability $y_{i,k}$ for that pixel as the classification $k_{opt}$ 302 of that pixel. The pixel i of the intermediate slice mask 248 is assigned 304 the class value $k_{opt}$ 302. After cycling through all N pixels 306, 308, the intermediate slice mask 248 is fully defined.

With reference returning to FIG. 5, the bone-air mask processor 134, which has been described with particular reference to FIGS. 10, 11, and 12, generates the binary bone-air mask 136. The assignment processor 138 replaces the non-vascular bone/air structures identified by the mask 136 with a gray level intensity.

Figure 13:
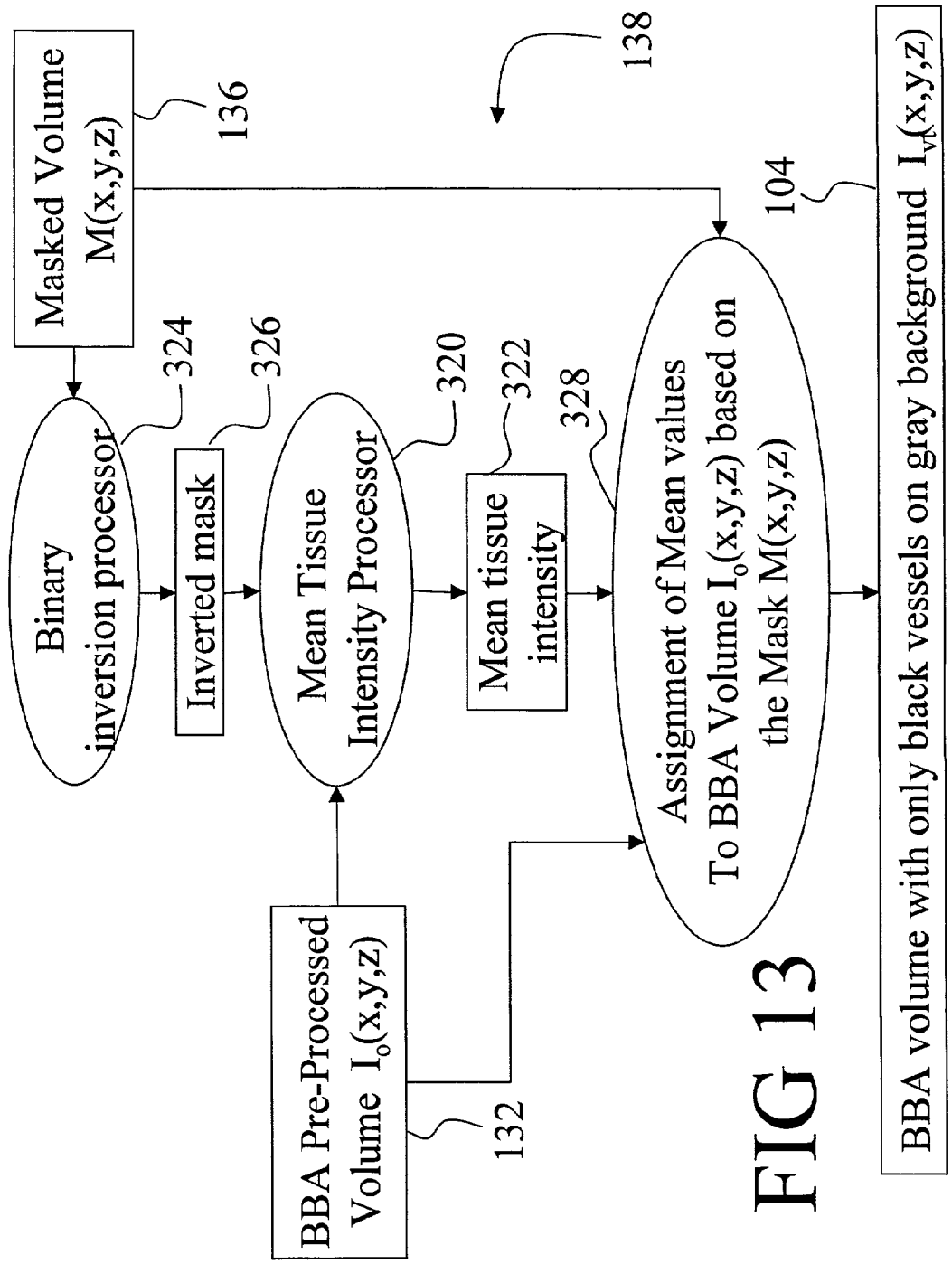
FIG. 13 shows a diagrammatic representation of a suitable embodiment of the assignment processor of FIG. 5.

With continuing reference to FIG. 5 and with further reference to FIG. 13, a suitable embodiment of the assignment processor 138 is described. A replacement gray level is calculated 320 from the pre-processed volume $I_o(x,y,z)$ 132 and the masked volume $M(x,y,z)$ 136 as the mean or average gray tissue intensity 322. The mean tissue intensity 322 is the average intensity of the tissue class pixels identified using the mask $M(x,y,z)$ 136. Since the mask 136 is formed to identify the bone/air classified regions, it is of the wrong polarity for identifying the gray tissue class regions which are to be included in the mean gray level calculation 320. The mask $M(x,y,z)$ 136 is therefore inverted 324 in the binary sense to produce an inverted mask 326 that identifies the gray tissue class regions of the image, and this inverted mask 326 is input to the gray level calculator 320. The non-vascular black areas of the pre-processed volume $I_o(x,y,z)$ 132 identified by the inverted masked volume 326 are replaced 328 by the mean tissue intensity 322 to create the BBA volume $I_{vt}(x,y,z)$ 104 which has only black vascular structures on a gray tissue background. Although the mean tissue intensity 322 is used in the exemplary embodiment, use of another representative gray intensity levels for the replacement is also contemplated. For example, a median gray level intensity could instead be used.

Figure 14:
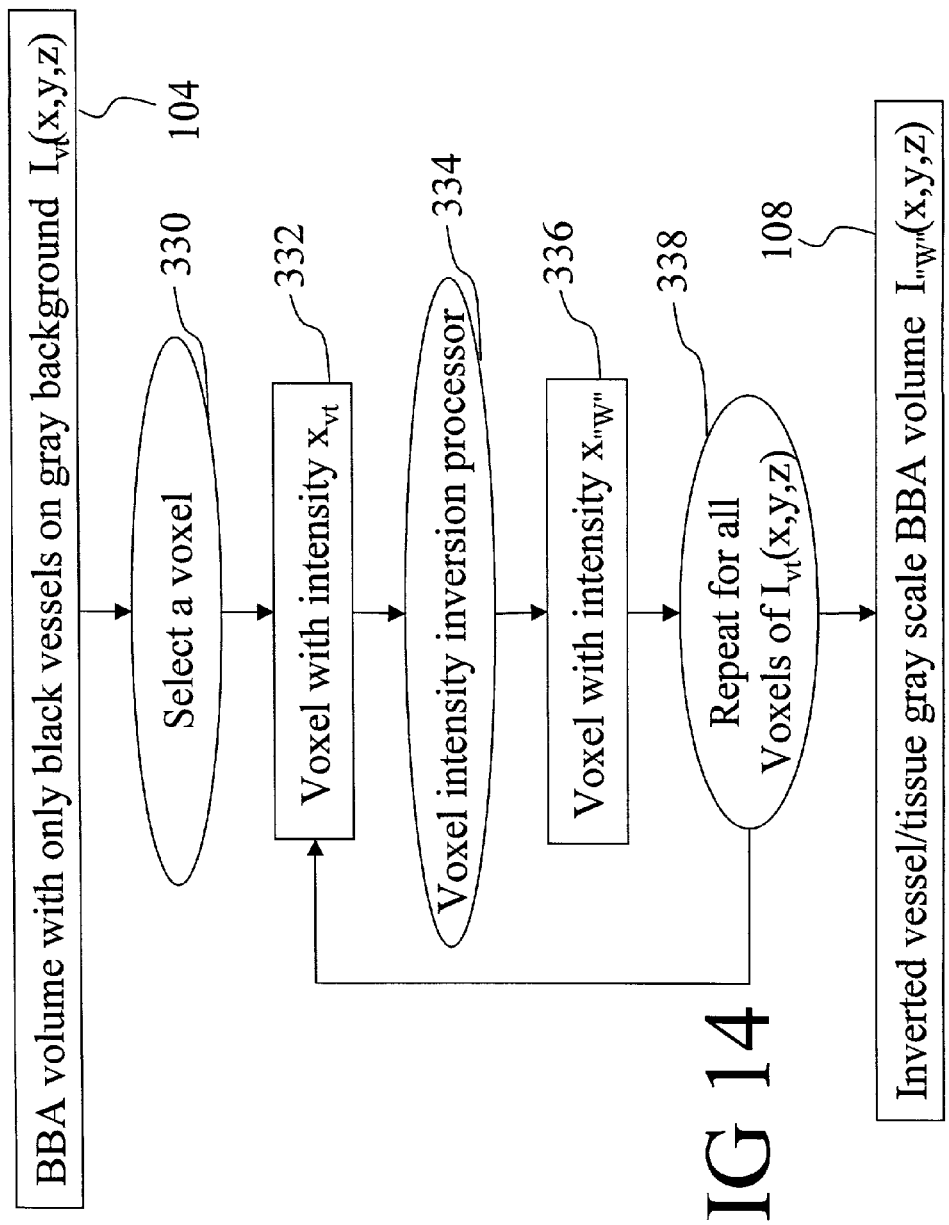
FIG. 14 shows a diagrammatic representation of a suitable embodiment of the intensity inversion processor of FIG. 5.

With continuing reference to FIG. 5 and with further reference to FIG. 14, the BBA volume $I_{vt}(x,y,z)$ 104 is intensity-inverted 106 to create the intensity-inverted vessels/tissue gray scale BBA volume $I_{\cdot w \cdot}(x,y,z)$ 108 in which blood vessels are represented by high intensity, i.e. appear white. A voxel is selected 330 from the BBA volume $I_{vt}(x,y,z)$ 104. The intensity of the selected voxel is designated $x_{vt}$. A voxel intensity inversion processor 334 intensity-inverts the voxel to produce a voxel intensity $x_{\cdot w \cdot}$ 336. The intensity inversion is repeated 338 for all the voxels comprising the BBA volume $I_{vt}(x,y,z)$ 104 to generate the intensity-inverted vessels/tissue gray scale BBA volume $I_{\cdot w \cdot}(x,y,z)$ 108.

In a suitable embodiment, the voxel intensity inversion processor 334 performs the inversion according to:

$$x_{\cdot w \cdot} = (2_n - 1) - x_{vt} \quad (9)$$

where n is the number of bits per voxel. For example, if n=8 then $x_{\cdot w \cdot} = 255 - x_{vt}$, and so a low intensity black pixel having $x_{vt} = 0$ converts to a high intensity $x_{\cdot w \cdot} = 255$. Although a linear voxel intensity inversion transformation has been described with reference to equation (9), other intensity inversion transformations are also contemplated, such as non-linear transformations which advantageously account for non-linearities in the intensity data.

With continuing reference to FIG. 5, the plurality of widths 150 are selected 146, e.g. ranging from the minimum width 152 which is preferably determined by the image resolution or by a user input to a maximum width corresponding to the largest blood vessel in the image. For each width $W_i$ 154, a vessel segmentation 156 is performed to produce the segmented binary volume $I_{i,bin}(x,y,z, W_i)$ 158 that contains vascular structures of width $W_i$ 154. By iterating 160 through all widths and compositing 162 the resulting images $I_{i,bin}(x,y,z, W_i)$ 158, the final binary vessel volume $I_F(x,y,z)$ 112 is generated.

Figure 15:
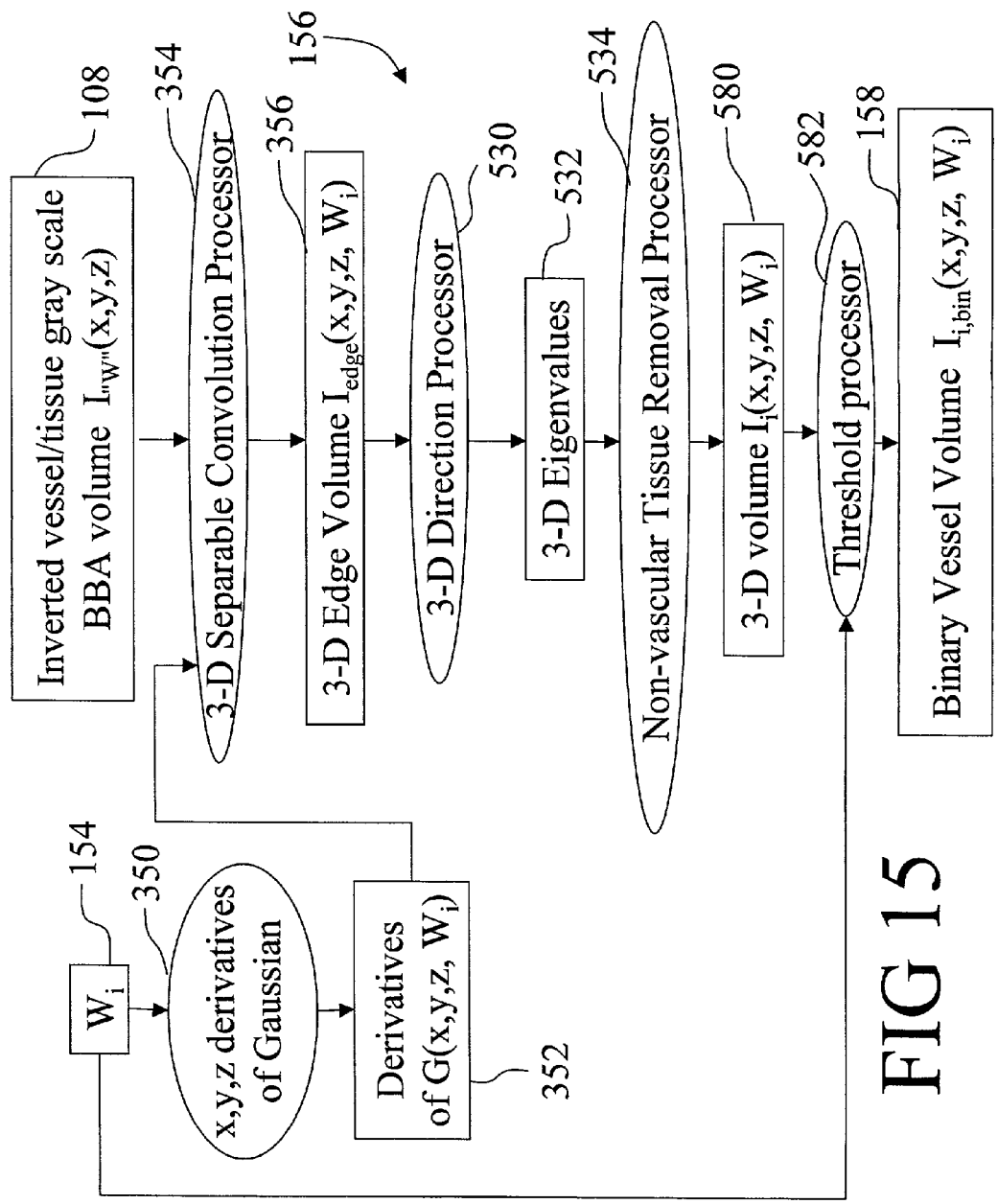
FIG. 15 shows a diagrammatic representation of a suitable embodiment of the vessel segmentation processor of FIG. 5.

With reference to FIG. 15, a suitable embodiment of the vessel segmentation processor 156 is described. The processor segments the inverted vessel/tissue gray scale BBA volume $I_{\cdot w \cdot}(x,y,z)$ 108 whose intensity polarity (having vessels at high intensity, i.e. white) facilitates the segmentation process. The segmentation is performed at the width $W_i$ 154, as described previously with reference to FIG. 5. The embodiment of the processor 156 employs second derivatives of the image 108 in the form of a Hessian matrix analysis.

The second order information, i.e. the information contained in the Hessian matrix, has an intuitive justification in the context of tubular structure detection. The Taylor expansion of an image I(r) gives the second order directional derivative as:

$$\delta r^T H(r, W_i) \delta r = \left(\frac{\partial}{\partial \delta r}\right)\left(\frac{\partial}{\partial \delta r}\right) I(r, W_i). \quad (10)$$

The main concept is to perform eigenvalue analysis of the Hessian matrix which extracts the principle directions in which the local second order structure of the image can be decomposed. Since this directly gives the direction of the smallest curvature (along the direction of the vessel), application of several filters in multiple orientations is avoided. This latter approach is computationally more expensive and requires discretization of the orientation space. If $\lambda_{W_i,k}$ is the eigenvalue corresponding to the $k^{th}$ normalized eigenvector $u_{o,k}$ of the Hessian matrix $H_{W_i}$ computed at the scale $W_i$ 154, then the eigenvalues are defined as:

$$H_{W_i} u_{W_i,k} = \lambda_{W_i,k} u_{W_i,k} \quad (11)$$

Equation (11) has a geometrical interpretation. The eigenvalue decomposition extracts three orthonormal directions that are invariant up to a scaling factor when mapped by the Hessian matrix. In particular, a spherical neighborhood centered at $r_o$ having a radius of unity will be mapped by the Hessian matrix onto an ellipsoid whose axes are along the directions given by the eigenvectors of the Hessian matrix and the corresponding axis semi-lengths are the magnitudes of the respective eigenvalues. This ellipsoid locally describes the second order structure of the image. Thus, the problem comes down to estimating the eigenvalues and eigenvectors at each voxel location in the three-dimensional volume $I_{\sim W''}(x,y,z)$ 108.

With continuing reference to FIG. 15, the second order derivatives are estimated on a scale $W_i$ 154 by convolving the image $I_{\sim W''}(x,y,z)$ 108 with a Gaussian function $G(x,y,z, W_i)$ with a variance or standard deviation functionally related to $W_i$ 154 which is differentiated 350 to obtain second order derivatives 352. The second derivative of a Gaussian kernel at scale $W_i$ 154 generates a symmetric and generally positive probe kernel with a negative central portion in the range $(-W_i, W_i)$ that measures the contrast between regions inside and outside the range $(-W_i, W_i)$.

Figure 16:
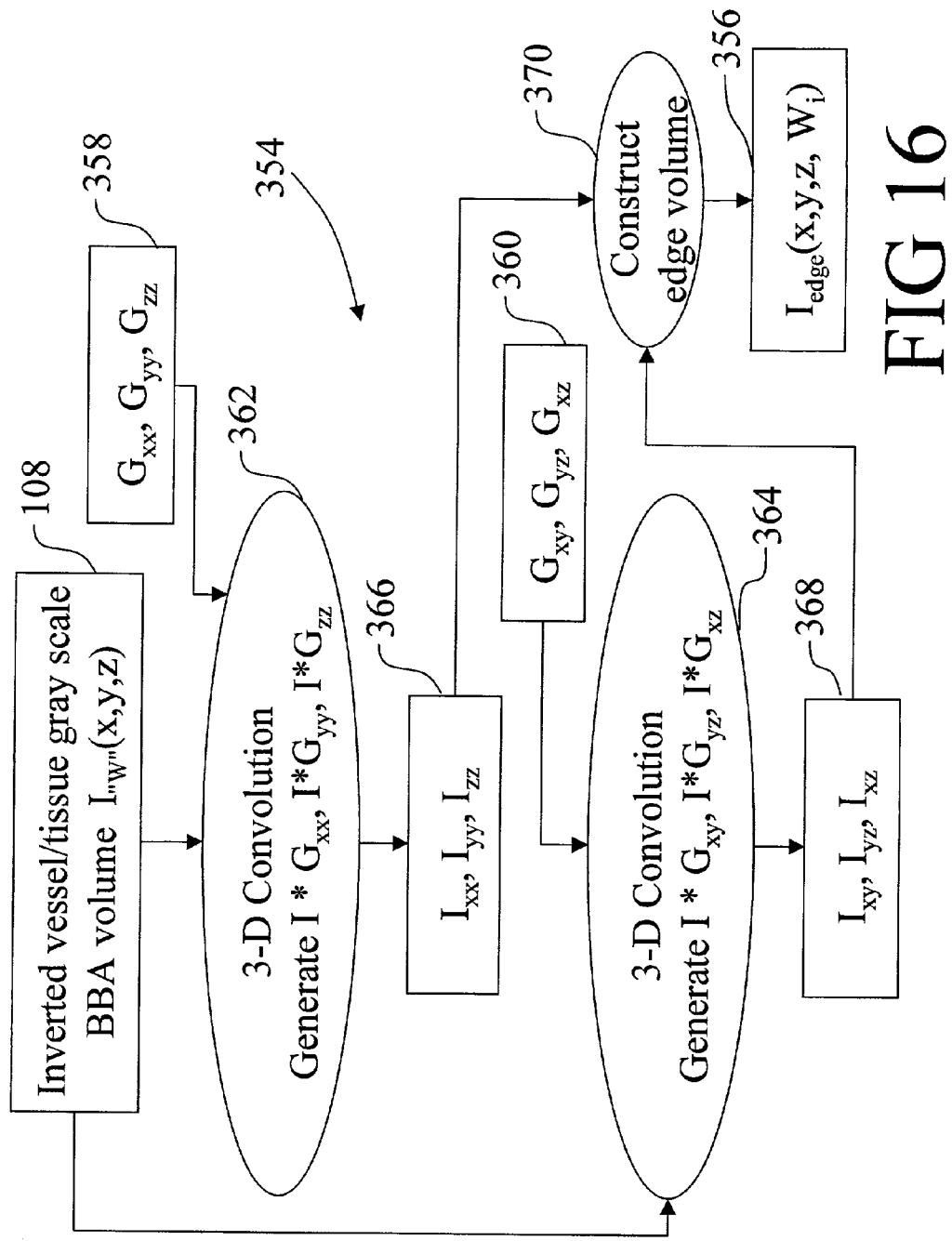
FIG. 16 shows a diagrammatic representation of a suitable embodiment of the 3-D separable convolution processor of FIG. 15.

With continuing reference to FIG. 15 and with further reference to FIG. 16, in a preferred embodiment the probe Gaussian second order derivative 352 is convolved with the image $I_{\sim W''}(x,y,z)$ 108 using a separable convolution processor 354 to generate an edge volume $I_{edge}(x,y,z,W_i)$ 356. In this method, second Gaussian derivatives $G_{xx}$, $G_{yy}$, $G_{zz}$ 358 and mixed second Gaussian derivatives $G_{xy}$, $G_{yz}$, $G_{xz}$ 360 are obtained. The second order Gaussian derivatives 358 and mixed second order Gaussian derivatives 360 are convolved 362, 364 with the intensity-inverted image $I_{\sim W''}(x, y, z)$ 108 to estimate the second order image derivatives $I_{xx}$, $I_{yy}$, $I_{zz}$ 366 and the second order mixed image derivatives $I_{xy}$, $I_{yz}$, $I_{xz}$ 368, respectively. The edge volume $I_{edge}(x,y,z, W_i)$ 356 is constructed 370 from the second order partial derivatives of the images 366, 368.

Figure 17:
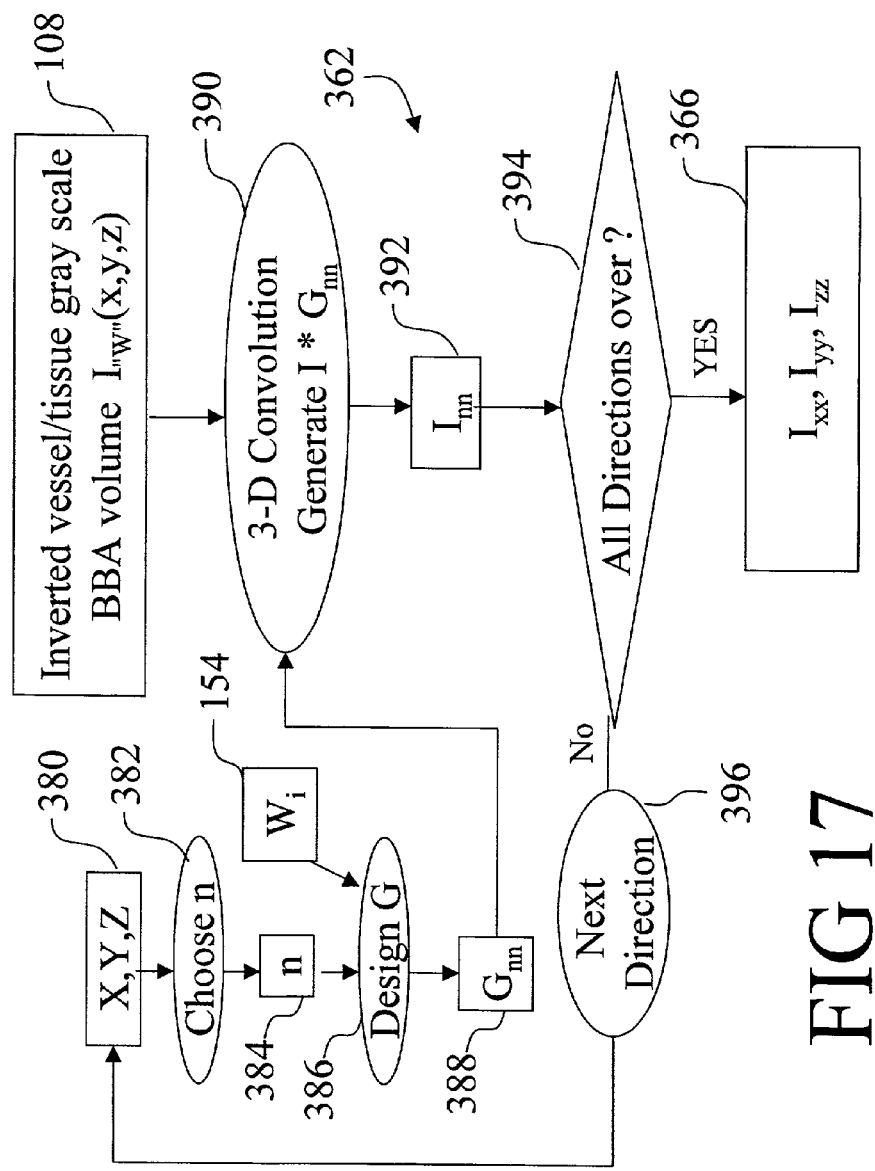
FIG. 17 shows a diagrammatic representation of a suitable embodiment of the 3-D second order Gaussian derivative convolution processor of FIG. 16.

With reference to FIG. 17, the convolving 362 of the image $I_{\sim W''}(x,y,z)$ 108 with the second Gaussian derivatives $G_{xx}$, $G_{yy}$, $G_{zz}$ 358 is computed as follows. From the set $\{x,y,z\}$ of orthogonal spatial directions 380 a direction n 384 is selected 382. The Gaussian $G(x,y,z, W_i)$ is created and the second partial derivative with respect to n 384, namely $G_{nn}$ 388, is obtained 386. The convolving 390 is performed according to:

$$I_{nn}(x,y,z,W_i)=I_{\sim W''}(x,y,z)*G_{nn}(x,y,z,W_i) \quad (12)$$

where "*" is the convolution operator, and the directional second order image derivative $I_{nn}$ 392 is generated. The process is repeated 394, 396 for the three directions $\{x,y,z\}$ 380 to generate the second order image derivatives $I_{xx}$, $I_{yy}$, $I_{zz}$ 366.

Figure 18:
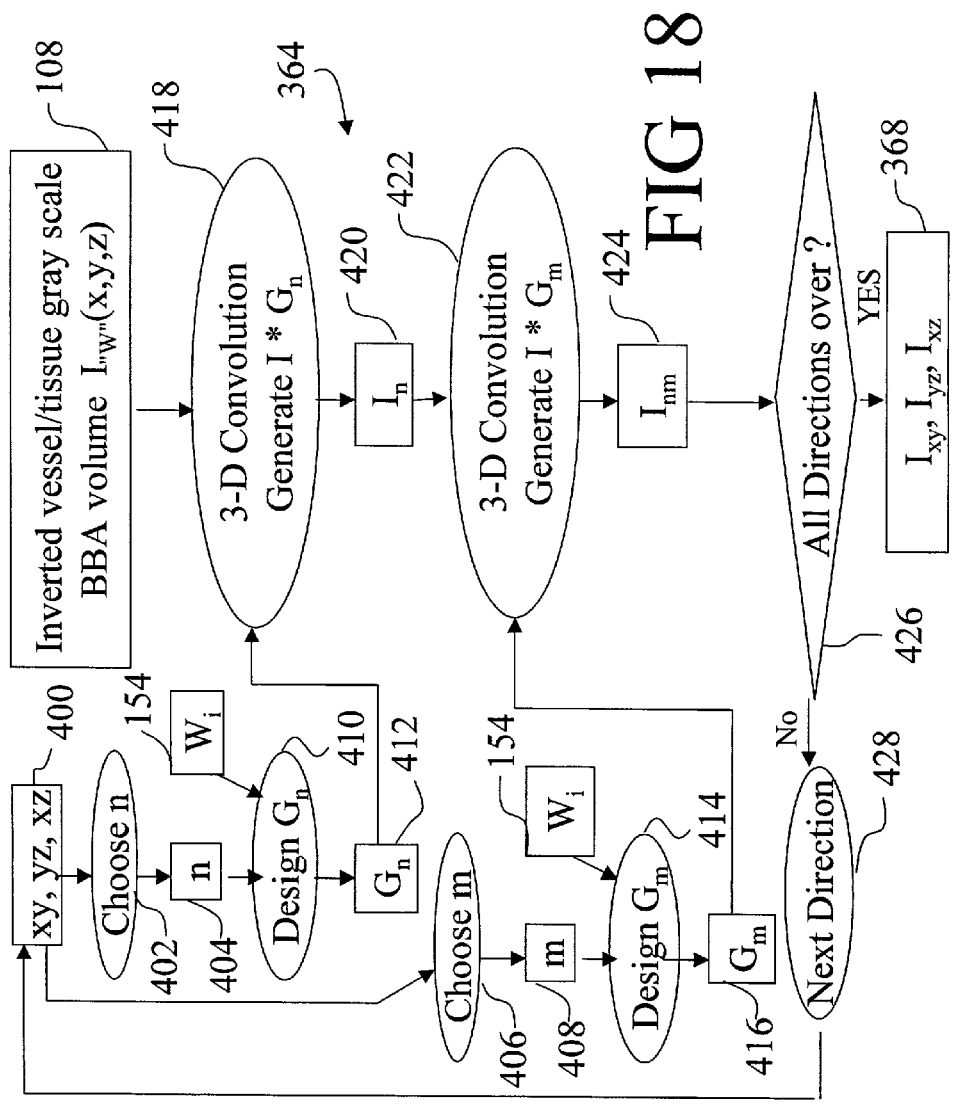
FIG. 18 shows a diagrammatic representation of a suitable embodiment of the 3-D mixed Gaussian derivative convolution processor of FIG. 16.

With reference to FIG. 18, the convolving 364 of the image $I_{\sim W''}(x,y,z)$ 108 with the mixed second Gaussian derivatives $G_{xy}$, $G_{yz}$ $G_{xz}$ 360 is computed as follows. From the set $\{xy,yz,xz\}$ 400 a mixed partial $\{nm\}$ 404, 408 is selected 402, 404. The Gaussian $G(x,y,z, W_i)$ is created and the first partial derivative with respect to n 404, namely $G_n$ 412, is obtained 410. Similarly, the first partial derivative with respect to m 408, namely $G_m$ 416, is obtained 414. The convolving 364 is performed in separable mode according to:

$$I_{nm}(x,y,z,W_i)=[\{I_{\sim W''}(x,y,z)*G_n(x,y,z,W_i)\}*G_m(x,y,z,W_i)] \quad (13)$$

where "*" is the convolution operator. Thus, the convolving 364 is separated into a first convolving 418 that produces an intermediate image $I_n(x,y,z, W_i)$ 420 followed by a second convolving 422 which produces the desired $I_{nm}(x,y,z, W_i)$ 424. The process is repeated 426, 428 for the three combinations $\{xy,yz,xz\}$ 400 to generate the mixed second order image derivatives $I_{xy}$, $I_{yz}$, $I_{xz}$ 368.

Figure 19:
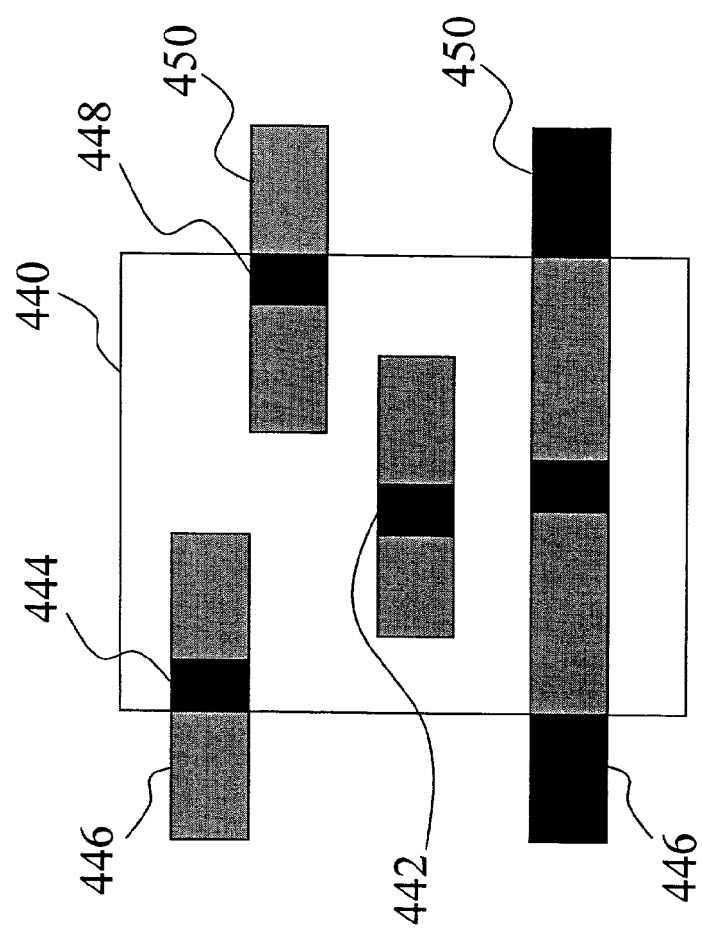
FIG. 19 shows a diagrammatic representation of representative image element positions within the image and the associated side paddings employed in the convolving.

With reference back to FIG. 16 and with further reference to FIG. 19, an additional aspect of the described separable convolving process for estimating the second order derivatives 358, 360 involves padding the image space. As seen in FIG. 19, where a two-dimensional exemplary image 440 is shown, numerical implementation of the convolving for an element at (x,y) requires image elements (e.g., voxels or pixels) on either size of (x,y). In the exemplary case 442, these side elements are taken from the image 440. However, if the image element is on the left side 444, left-hand padding 446 needs to be supplied. Similarly, if the image element is on the right side 448, right-hand padding 450 needs to be supplied. For very large widths $W_i$ 154, both left- and right side paddings 446, 450 can be supplied.

Figure 20:
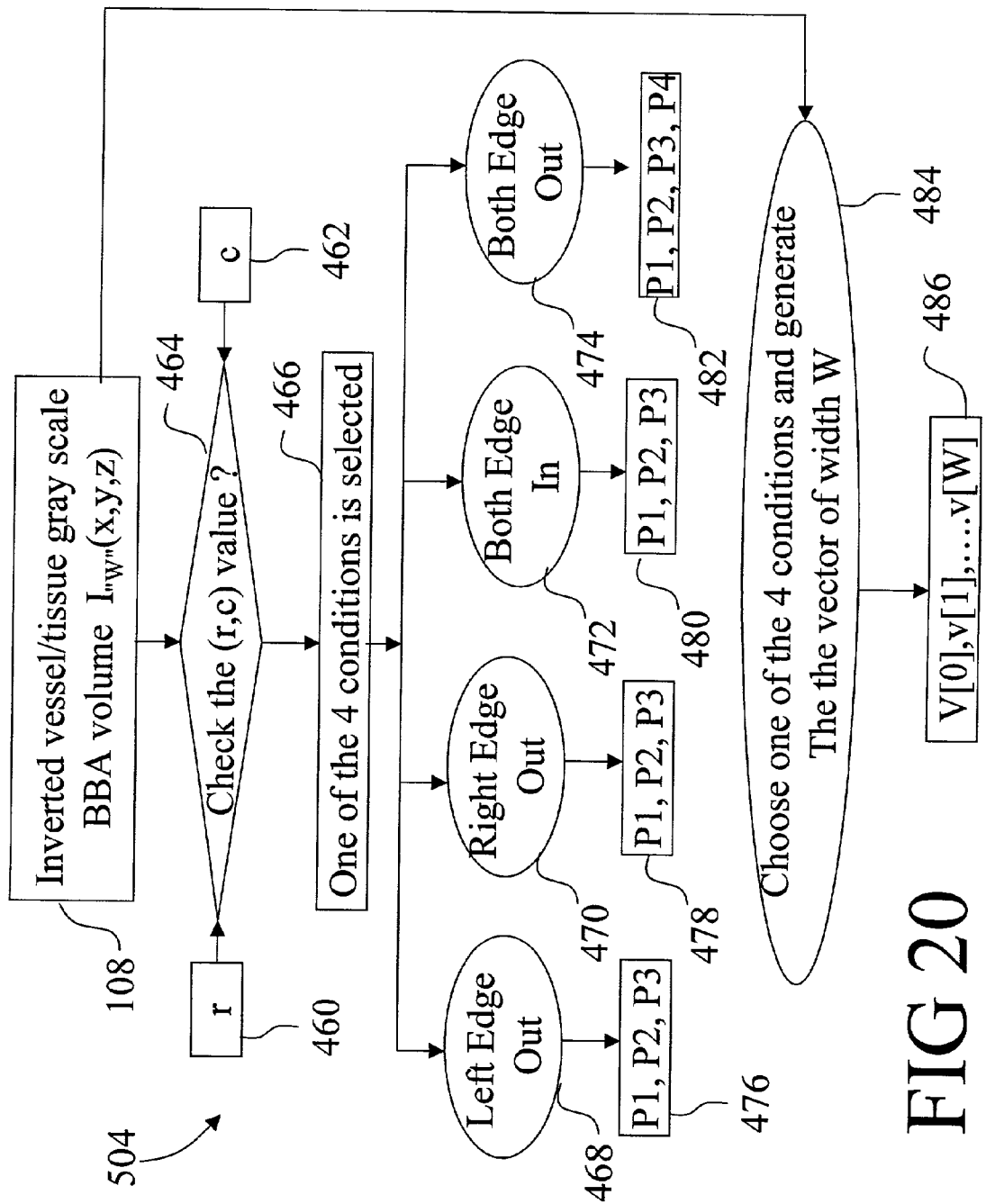
FIG. 20 shows a diagrammatic representation of a suitable embodiment of the padding algorithm for constructing a vector for use in conjunction with the Gaussian derivative convolution processor of FIG. 16.

With continuing reference to FIGS. 16 and 19 and with further reference to FIG. 20, an image element with coordinates (r,c) 460, 462 is selected from the image 108. This image element is checked 464 to select 466 among the four possible conditions illustrated in FIG. 19: left side extending beyond the image 468; right side extending beyond the image 470; neither side extending beyond the image 472; or both sides extending beyond the image 474. Appropriate padding is selectively supplied 476, 478, 480, 482, e.g. by duplicating pixels at the edge of the image 108, by zero-filling, or by other suitable means, and a vector 486 is generated 484 which is of length $W_i$ 154.

Figure 21:
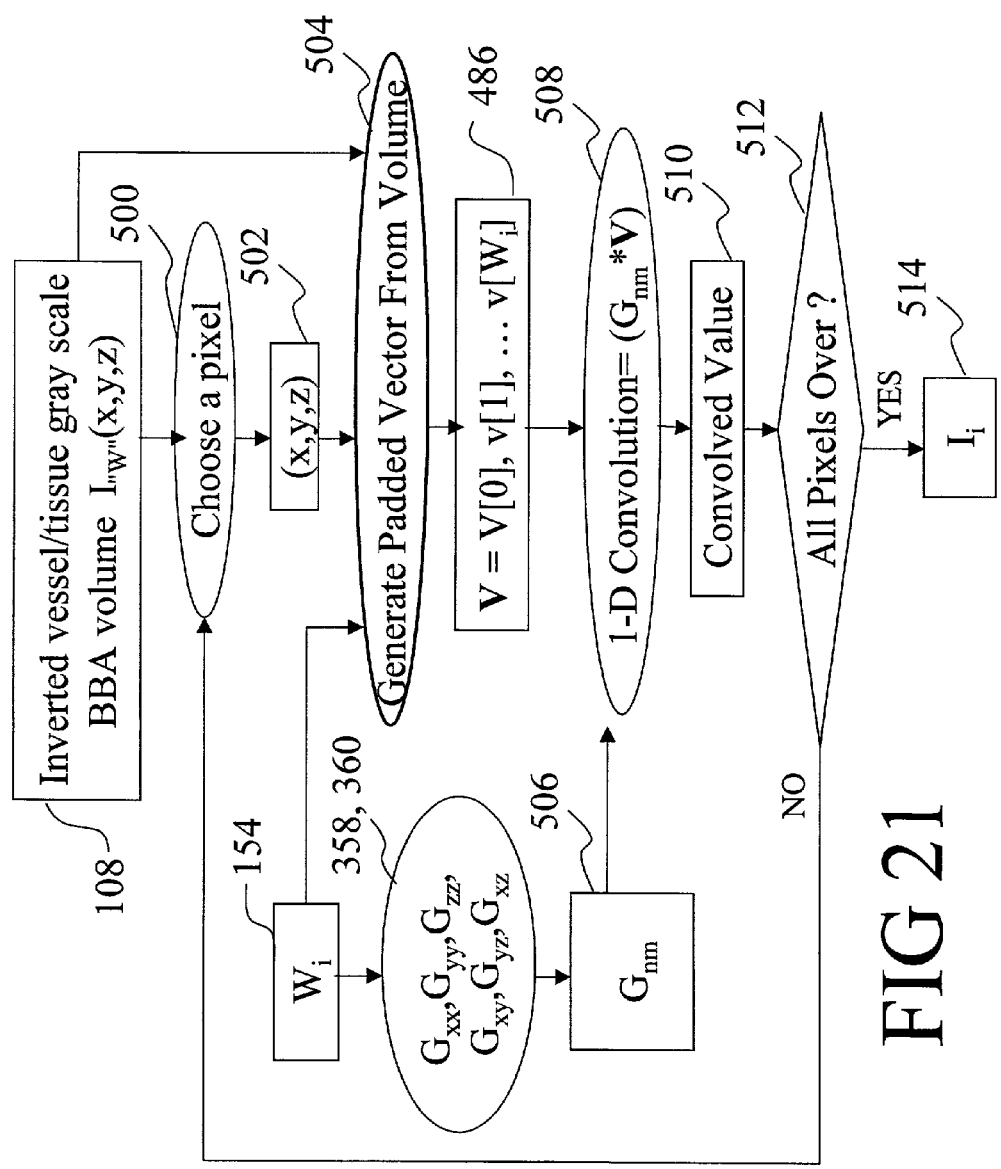
FIG. 21 shows a diagrammatic representation of a suitable embodiment of the convolution processor that employs a padded vector formed in accordance with the method shown in FIG. 20.

With continuing reference to FIGS. 16 and 19–20 and with further reference to FIG. 21, the convolving is preferably carried out using a vector approach as follows. An image element 502 is selected 500 from the image $I_{\sim W''}(x, y,z)$ 108. The vector 486 is generated 504 about the image element 502, using padding if necessary as described with reference to FIGS. 19 and 20. A second order or mixed Gaussian derivative $G_{nm}$ 506 is selected from the six derivatives 358, 360. The padded vector 484 is convolved 508 with the selected Gaussian derivative $G_{nm}$ 506 to generate the convolved value 510. This convolution is a one-dimensional convolution of two one-dimensional vectors and comprises element-by-element multiplication, shifting, and adding of the components of the 1-D vectors. The convolving process is repeated 512 for all pixels to generate the convolved image volume $I_{nm}(x,y,z, W_i)$ 514.

With reference returning to FIG. 15, the convolving 354, described above with reference to FIGS. 16–21, produces the edge volume $I_{edge}(x,y,z, W_i)$ 356. The edge volume 356 is used as the input to a Hessian matrix-based direction processor 530 which produces Hessian matrix eigenvalues 532 which are in turn used in a non-vascular tissue removal processor 534 to characterize the image elements.

Figure 22:
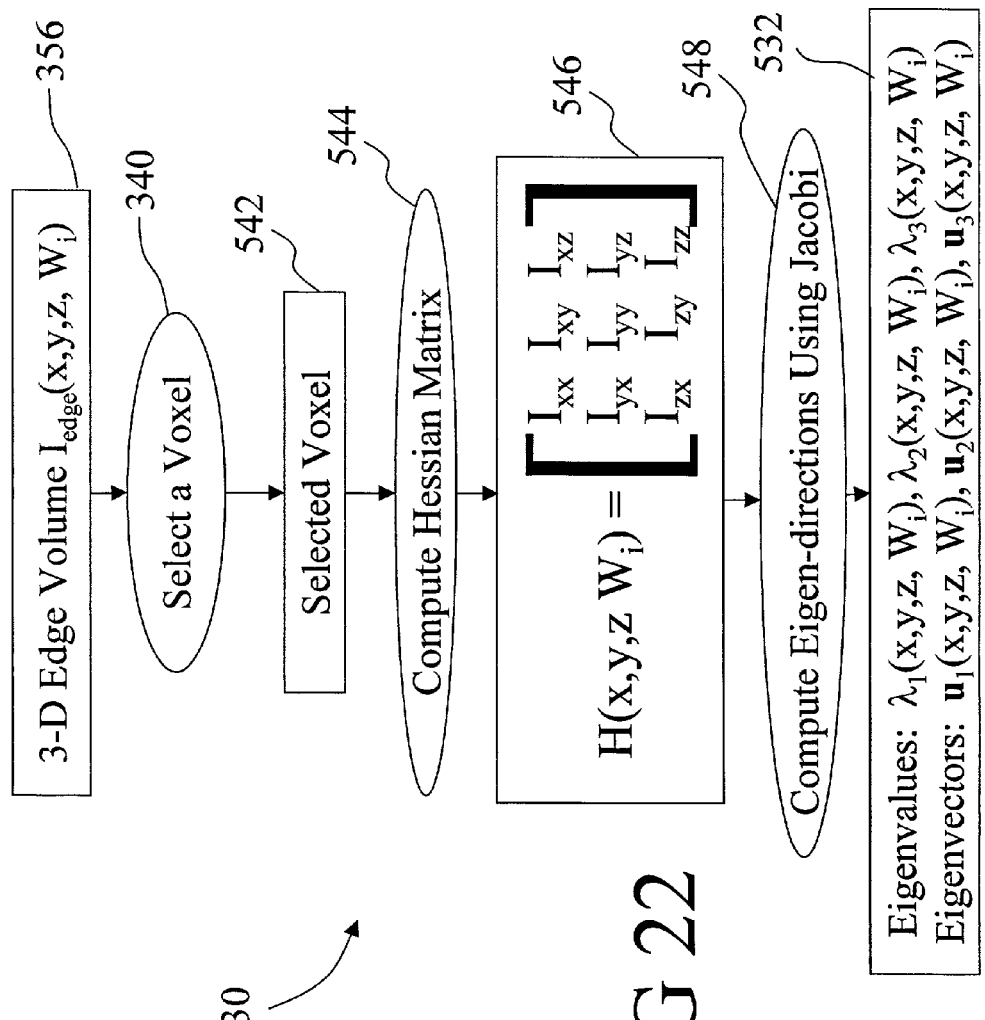
FIG. 22 shows a diagrammatic representation of a suitable embodiment of the direction processor of FIG. 15.

With reference to FIG. 22, a suitable embodiment for obtaining the eigenvalues 532 is described. A voxel or image element 542 is selected 540 from the edge volume $I_{edge}(x, y,z, W_i)$ 356. The Hessian matrix 546 is computed 544 and Jacobi transformations 548 known to the art are applied to diagonalize the Hessian matrix. The eigenvalues 532 are the diagonal elements of the diagonalized matrix.

With reference returning to FIG. 15, the eigenvalues 532 of the Hessian matrix $H(x,y,z, W_i)$ 546 are advantageously applied by the tissue removal processor 534 in characterizing the likelihood that the voxel at (x,y,z) is included in a blood vessel of diameter $W_i$ 154. Based on the likelihood characterization, the voxel is classified as vascular or non-vascular by the tissue removal processor 534.

In a suitable embodiment of the tissue removal processor 534, a voxel score is computed according to:

$$VS(\lambda_1, \lambda_2, \lambda_3, \gamma) = \begin{cases} 0 \text{ if } |\lambda_2| > 0 \text{ or } |\lambda_3| > 0 \\ \left(1 - \exp\left(-\frac{R_A^2}{2\alpha^2}\right)\right)\exp\left(-\frac{R_B^2}{2\beta^2}\right)\left(1 - \exp\left(-\frac{S^2}{2\epsilon^2}\right)\right) \end{cases} \quad (14)$$

where $$R_A^2 = \frac{|\lambda_2|}{|\lambda_3|}, \quad (15)$$

$$R_B^2 = \frac{|\lambda_1|}{\sqrt{|\lambda_2 \lambda_3|}}, \quad (16)$$

$$S = \sqrt{\lambda_1^2 + \lambda_2^2 + \lambda_3^2} \quad (17)$$

$\lambda_1$ corresponds to the eigenvector in the blood vessel direction, $\gamma$ is the Lindeberg constant known to the art, and $\alpha$, $\beta$, and $\epsilon$ are thresholds that control the sensitivity of the filter to the image features of blobbiness, plane/line difference, and hangness, respectively.

Figure 23:
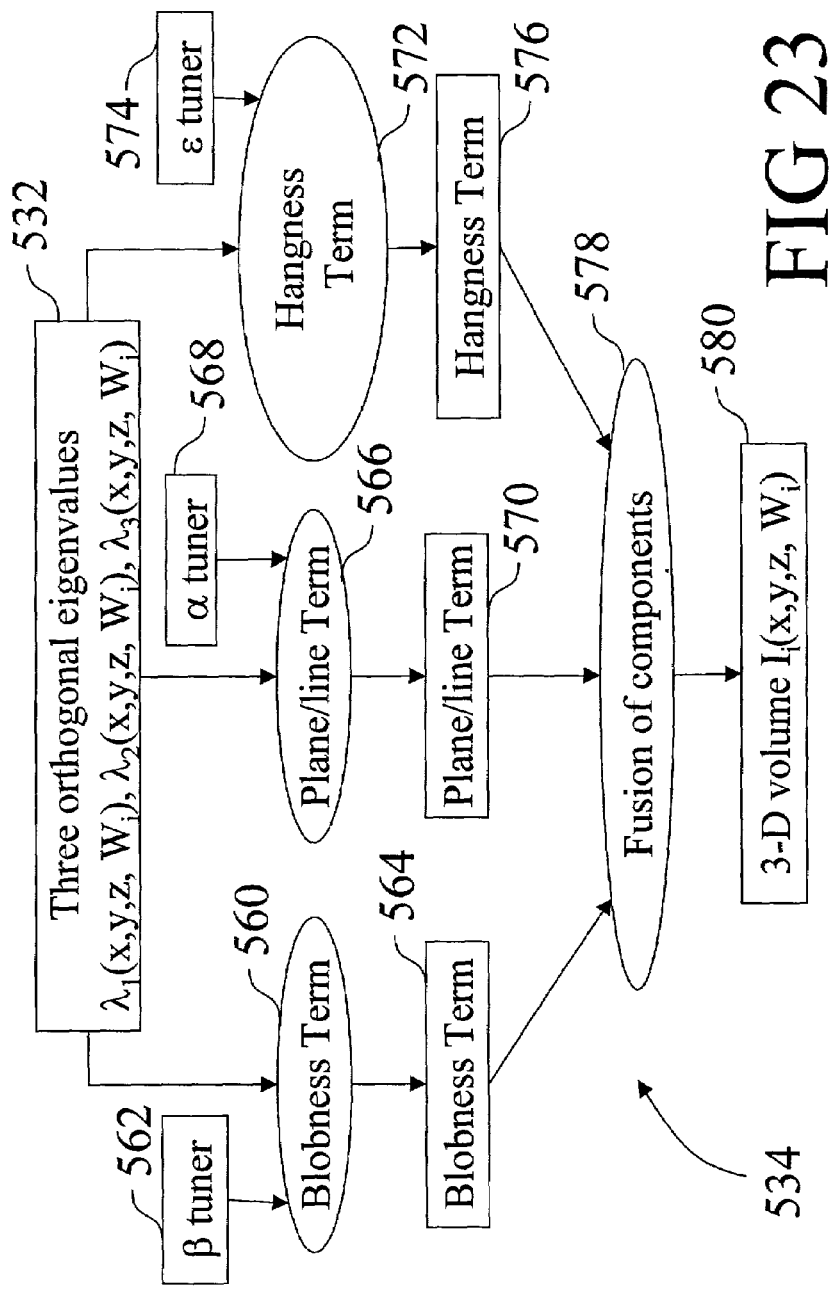
FIG. 23 shows a diagrammatic representation of a suitable embodiment of the non-vascular tissue removal processor of FIG. 15.

With reference to FIG. 23, the vessel score of equation (14) is further described. The overall vessel score expression of equation (3) can be decomposed into three terms or components which are functions of the eigenvalues 532. A blobbiness or fatness term 560 is given by:

$$\text{blobbiness} = \exp\left(-\frac{R_B^2}{2\beta^2}\right) \quad (18)$$

where a tuning input $\beta$ 562 controls the sensitivity of the filter to blobbiness. A typical value is $\beta$=0.5. The tuned filtering produces a blobbiness term 564. This term indicates the deviation from fatness by taking the ratio of the volume to the cross-section of the 3-D ellipsoids of second order. This ratio is the same as taking the three magnitudes of the three eigenvalues $\lambda_1$, $\lambda_2$, $\lambda_3$. Defining $\lambda_1$ as corresponding to the direction along the major axis of the ellipsoid, i.e. corresponding to the blood vessel axis, the fatness or blobbiness is computed using the norm of $\lambda_1$ to the square root of the product $\lambda_2*\lambda_3$ as shown in equation (16) above. However, the blobbiness cannot distinguish between a line and a planar structure.

A second filtering gives the in-plane or plane/line difference 566:

$$\left(1 - \exp\left(-\frac{R_A^2}{2\alpha^2}\right)\right) \quad (19)$$

where a tuning input $\alpha$ 568 controls the sensitivity of this filter. A typical value is $\alpha$=0.5. The tuned filtering produces an in-plane or plane/line difference term 570. This term indicates the ratio of the largest area of cross-section to the largest axis of this cross-section represented by $\lambda_2$ and $\lambda_3$. Thus, the in-plane or plane/line difference is computed using the norm of $\lambda_2$ to $\lambda_3$ as indicated in equation (15) above.

Both the blobbiness term 564 and the in-plane term 570 are geometry factors which are gray level invariant, i.e. they remain constant under intensity re-scaling. Additional information about the likelihood that the voxel under consideration is part of a blood vessel of diameter $W_i$ 154 is contained in the intensity contrast and the connectivity of the voxels in the three-dimensional volume. This third "hangness" term is given by 572:

$$\left(1 - \exp\left(-\frac{S^2}{2\epsilon^2}\right)\right) \quad (20)$$

where a tuning input $\epsilon$ 574 controls the sensitivity of this filter. A typical value is $\epsilon$=0.5. The tuned filtering produces a hangness term 576. This term incorporates the observation that in angiography the vascular structure is typically brighter than the background due to the selective vascular imaging. The background dominant structures are suppressed in this filter by emphasizing derivatives of high signal content. Thus, the hangness term is computed using the energy of the Hessian which is the norm of the sum of the squares of the eigenvalues as shown in equation (17) above.

The three filtered terms, i.e. the blobbiness term 564, the in-plane term 570, and the hangness term 576 are fused 578 according to equation (14) to generate the vessel volume $I_i(x,y,z, W_i)$ 580 for the width $W_i$ 154.

Figure 24:
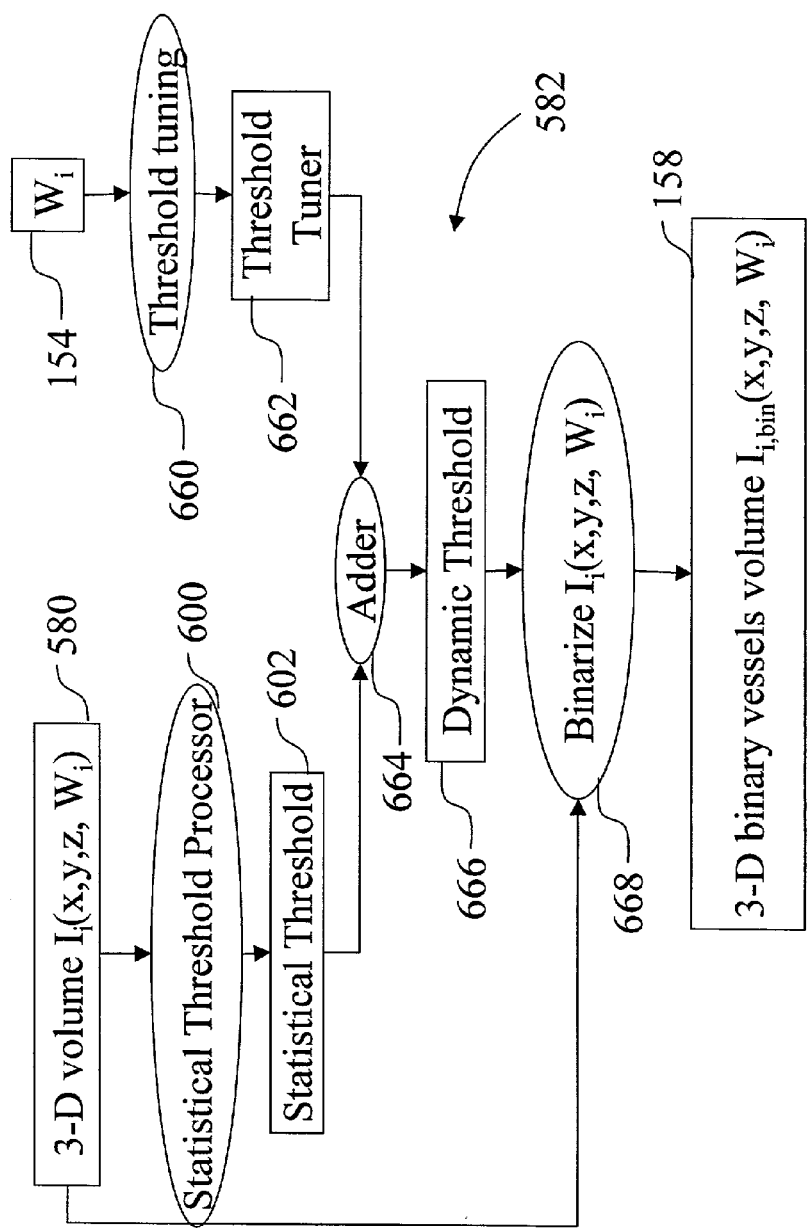
FIG. 24 shows a diagrammatic representation of a suitable embodiment of the threshold processor of FIG. 15.

With reference returning to FIG. 15 and with further reference to FIG. 24, the vessel volume $I_i(x,y,z, W_i)$ 580 is advantageously thresholded 582 to produce the binary vessel volume $I_{i,bin}(x,y,z, W_i)$ 158, which has a first binary value corresponding to vascular structures and a second binary value corresponding to non-vascular regions. The gray scale volume $I_i(x,y,z, W_i)$ 580 is analyzed by a statistical threshold processor 600 to produce a statistical threshold 602.

Figure 25:
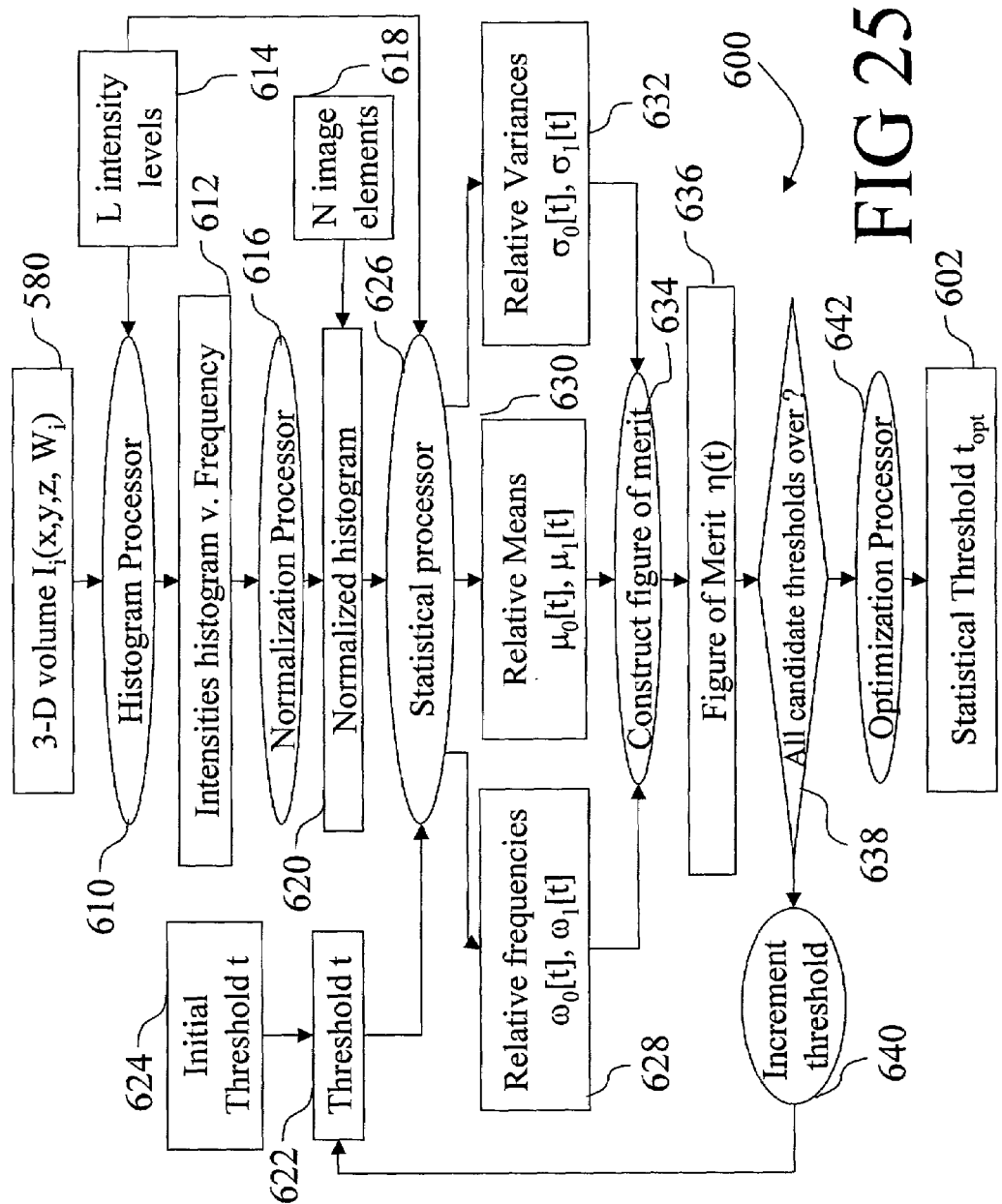
FIG. 25 shows a diagrammatic representation of a suitable embodiment of the statistical threshold processor of FIG. 24.

With continuing reference to FIG. 24 and with further reference to FIG. 25, a suitable statistical threshold processor 600 is described. A histogram 612 is constructed 610 of the intensities of the image elements (i.e. voxels, or pixels if the threshold calculation is done on a per/slice basis) comprising the image $I_i(x,y,z, W_i)$ 580. In constructing 610 the histogram 612, the number of occurrences (i.e., frequency $n_i$) of pixels with intensity i is plotted against the gray scale intensity i which has L possible values 614 ranging from 0 to $2^b-1$ where b is the number of bits per image element. In a preferred embodiment, the histogram is normalized 616 to define normalized frequencies $p_i=n_i/N$ where N 618 is the total number of image elements in the image, to produce a normalized histogram 620.

Those skilled in the art will recognize that the vascular pixels will typically form a first histogram portion having a peaked distribution centered about an average vascular image intensity, while the non-vascular regions will typically form a second peaked distribution portion centered about an average non-vascular background intensity. The normalized histogram 620 is analyzed statistically to identify a statistical threshold which separates the vascular and non-vascular portions.

With continuing reference to FIG. 25, a threshold index value t 622 is initially set to an initial value 624. The threshold t 622 divides the histogram into two sections, a first section below the threshold t 622 and a second section above the threshold t 622. A statistical processor 626 statistically analyzes the two sections. In a suitable embodiment, a Gaussian statistical model is used for the analysis. The partitions have the relative frequencies 628:

$$\omega_o[t] = \sum_{i=1}^{t} p_i, \quad \omega_1[t] = \sum_{i=t+1}^{L} p_i \qquad (21)$$

where $\omega_o$ is the fraction of image elements in the first partition, $\omega_1$ is the fraction of image elements in the second partition, and L is the number of levels 614. The mean values 630 for the partitions are:

$$\mu_o[t] = \sum_{i=1}^{t} i \frac{p_i}{\omega_o[t]}, \quad \mu_1[t] = \sum_{i=t+1}^{L} i \frac{p_i}{\omega_1[t]} \qquad (22)$$

and the standard deviations or variances 632 for the partitions are:

$$\sigma_o^2[t] = \sum_{i=1}^{t} \frac{(i-\mu_o[t])^2 p_i}{\omega_o[t]}, \quad \sigma_1^2[t] = \sum_{i=t+1}^{L} \frac{(i-\mu_1[t])^2 p_i}{\omega_1[t]}. \qquad (23)$$

A suitable figure of merit 636 is constructed 634 based on these statistical parameters, for example:

$$\eta[t] = \mu_o[t]\sigma_o^2[t] + \mu_1[t]\sigma_1^2[t] \qquad (24).$$

By iterating 638, 640 over the possible threshold values, e.g. over the range 1–254 for an 8-bit intensity gray scale with L=256, the figure of merit 636 and thus the threshold can be optimized 638 to yield an optimized statistical threshold 602.

Figure 26:
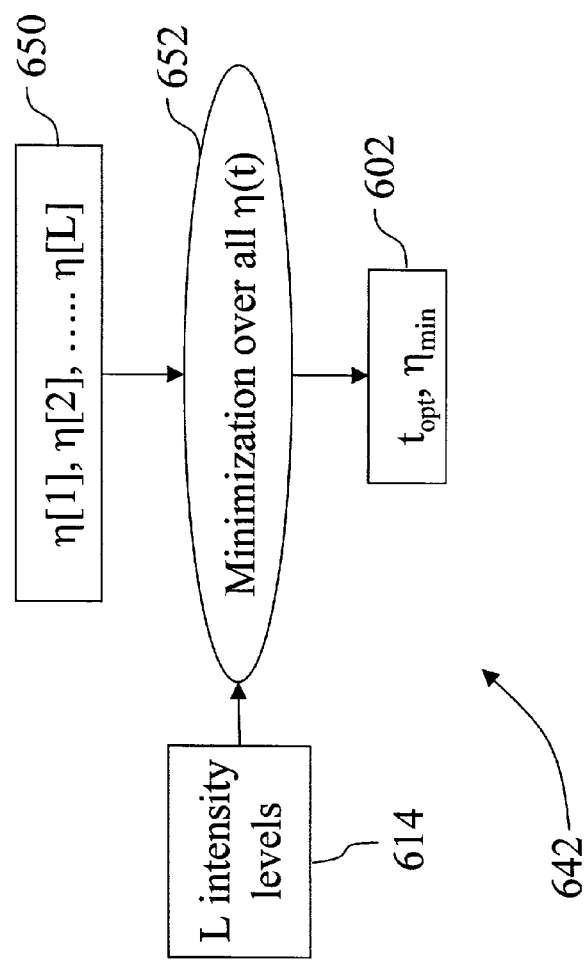
FIG. 26 shows a diagrammatic representation of a suitable embodiment of the optimization processor of FIG. 25.

With continuing reference to FIG. 25 and with further reference to FIG. 26, a suitable embodiment of the threshold optimization processor 638 is described. The figures of merit for all the threshold index values 650 is optimized 652, e.g. minimized, according to:

$$t_{opt} = \underset{t}{\operatorname{argmin}}\{\eta[t]\}. \qquad (25)$$

to select the optimum statistical threshold 602. This optimization function is the ratio of the in-between class variance to the total variance, i.e. $\sigma_B^2/\sigma_T^2$.

With reference returning to FIG. 24, the statistical threshold 602 calculated as described with reference to FIGS. 25 and 26 is modified by a threshold tuner which dynamically adjusts the threshold based on the width $W_i$ 154. A threshold tuning 660 produces a threshold tuner 662 which is added 664 to the statistical threshold 602 to generate a dynamic threshold 666. The threshold tuner 662 is typically about 0.5 for low widths $W_i$ 154. As the width increases, however, the Gaussian slope of the kernel changes. The threshold tuning 660 dynamically adjusts for this by increasing the threshold accordingly. The dynamic threshold 666 is used to binarize 668 the vessel volume $I_i(x,y,z, W_i)$ 580 for the width $W_i$ 154 to produce the binary vessels volume $I_{i,bin}(x,y,z, W_i)$ 158.

The binary vessels volume $I_{i,bin}(x,y,z, W_i)$ 158 and/or the gray scale vessel volume $I_i(x,y,z, W_i)$ 580 are suitable for effectuating various display modalities.

Figure 27:
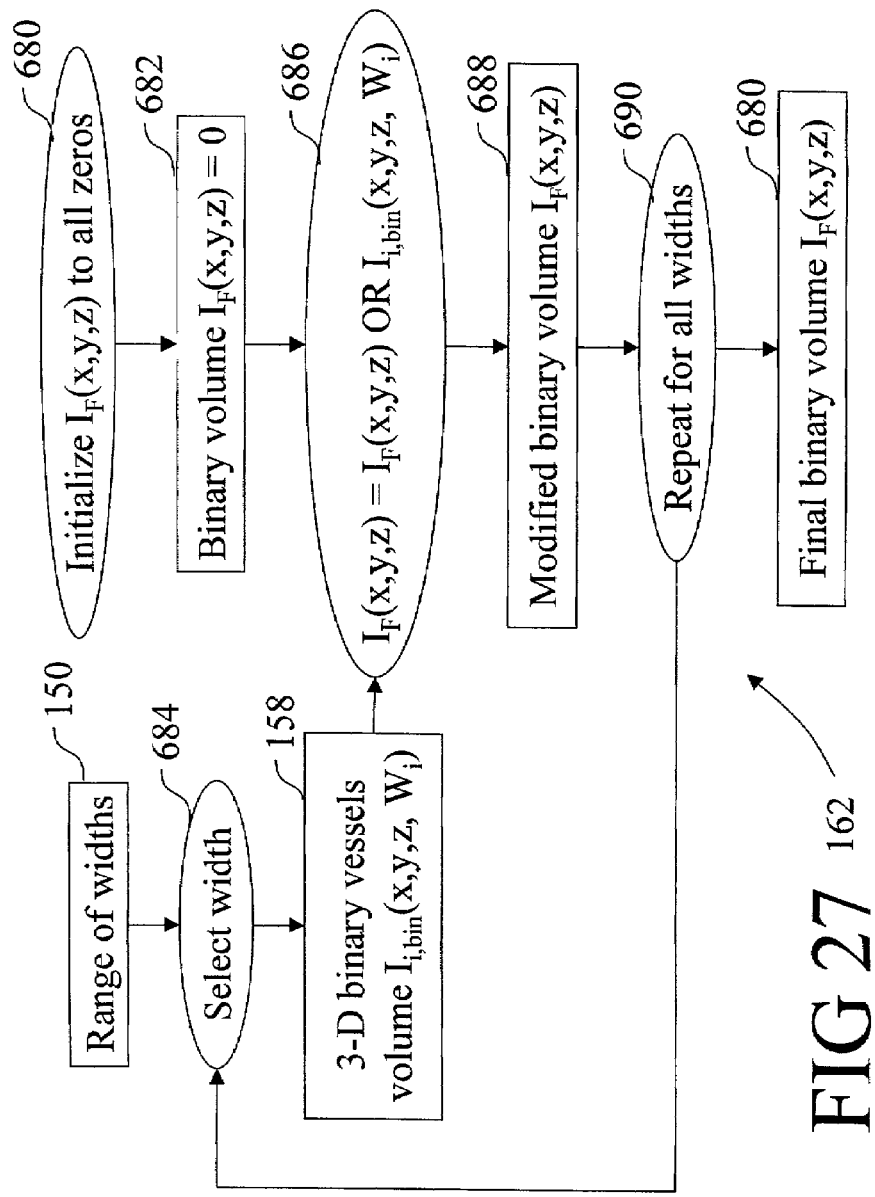
FIG. 27 shows a diagrammatic representation of a suitable embodiment of the vessel compositing processor of FIG. 5.
Figure 28:
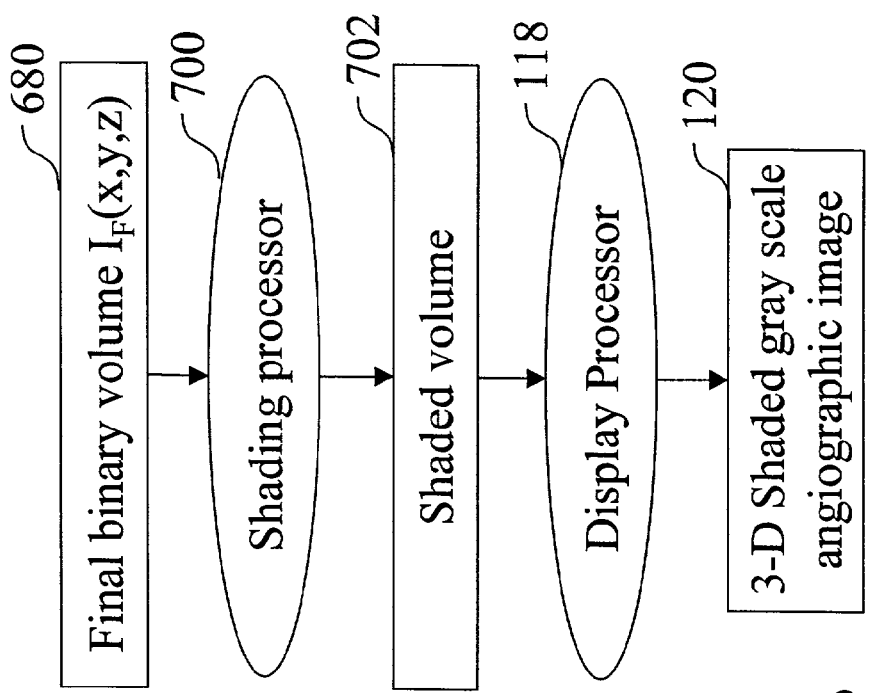
FIG. 28 shows a diagrammatic representation of a suitable embodiment for three-dimensional displaying of the final binary angiographic image of FIG. 5.

With reference back to FIG. 5 and with further reference to FIGS. 27 and 28, a suitable three-dimensional display embodiment is described. A three-dimensional binary vessel volume $I_F(x,y,z)$ with voxels corresponding to those of the binary vessels volume $I_{i,bin}(x,y,z, W_i)$ 158 is initialized 680 to zero to create a binary volume space 682. A width is selected 684 from the range of widths 150 and the corresponding binary vessels volume $I_{i,bin}(x, y, z, W_i)$ 158 is obtained. The volume $I_{i,bin}(x,y,z, W_i)$ 158 corresponding to width $W^i$ 154 is composited 686 with the volume $I_F(x,y,z)$ 682 according to:

$$I_F(x,y,z) = I_F(x,y,z) \text{ OR } I_{i,bin}(x,y,z,W_i) \qquad 26)$$

where "OR" is the binary addition operator, to generate a modified volume $I_F(x,y,z)$ 688. The process is iteratively repeated 690 for all widths in the range of widths 150 to produce a final binary vessels volume $I_F(x,y,z)$ 112.

With reference to FIG. 28, a suitable embodiment for the displaying of the final binary vessels volume $I_F(x,y,z)$ 112 is described. A shading processor 700 superimposes visually pleasing graphical shading to produce a shaded volume 702. In a suitable embodiment, the shading processor 700 uses a marching cube algorithm well known to those skilled in the art. Of course, other shading methods can also be employed. The shaded image 702 is input to the display processor 118, e.g. according to FIG. 4, to produce the 3-D angiographic image 120.

Figure 29:
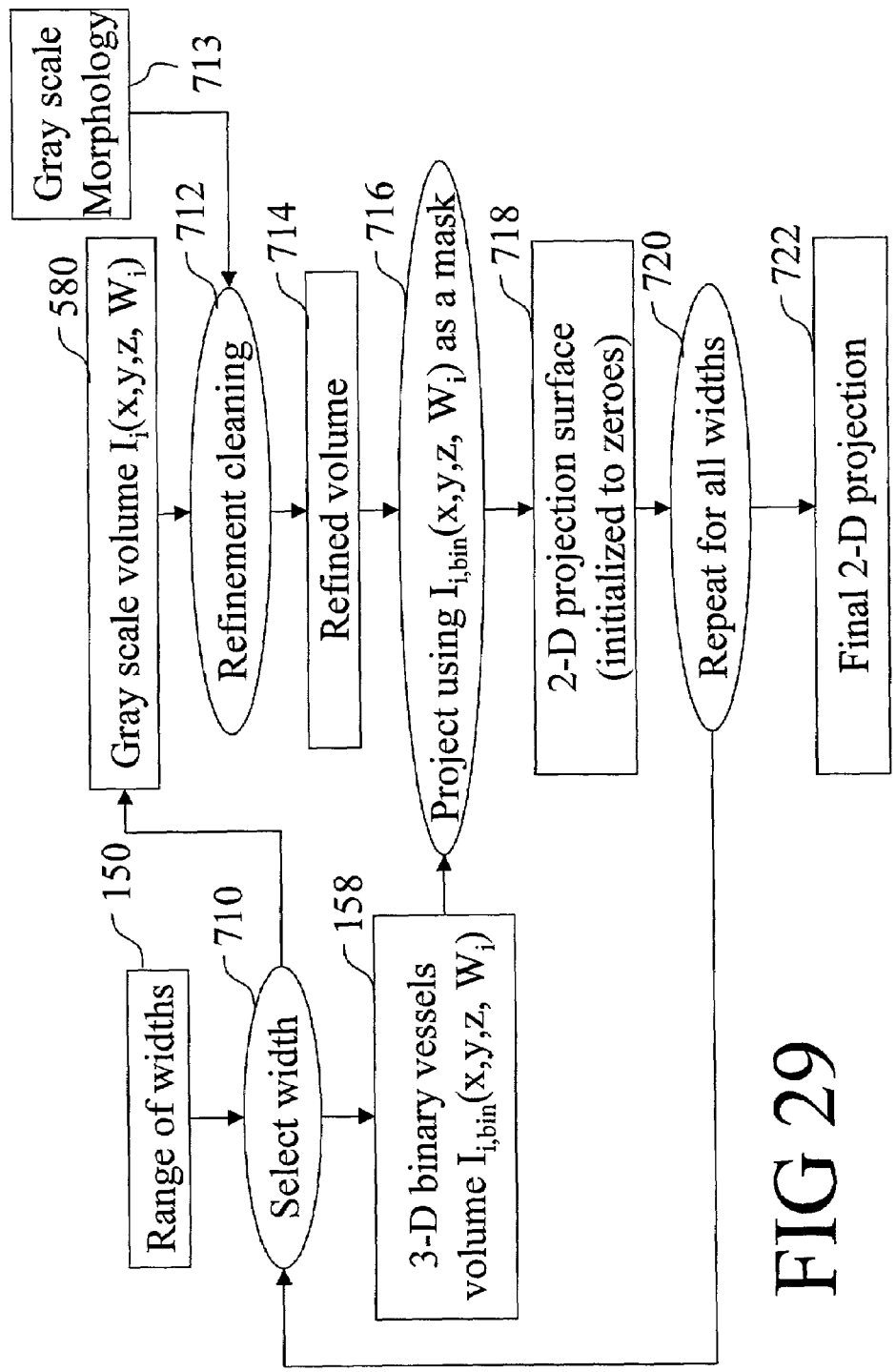
FIG. 29 shows a diagrammatic representation of a suitable embodiment for projecting the three-dimensional angiographic data to form a two-dimensional projection angiographic image.

With reference to FIG. 29, a suitable two-dimensional projection display embodiment is described. In this embodiment, the binary vessels volume $I_{i,bin}(x,y,z, W_i)$ 158 is used as a binary mask for the projecting of the gray scale vessel volume $I_i(x,y,z, W_i)$ 580. That is, only voxels identified by the binary vessels volume $I_{i,bin}(x,y,z, W_i)$ 158 as being part of the vasculature are projected. Furthermore, because the projecting process can accumulate outlying isolated "noise" voxels which typically consist of isolated voxels and pairs of isolated adjacent voxels, it is advantageous to perform a refinement cleaning of the volume $I_i(x,y,z, W_i)$ 580 prior to projection.

For a selected 710 width of the range of widths 150, the gray scale vessel volume $I_i(x,y,z, W_i)$ 580 and the binary vessels volume $I_{i,bin}(x,y,z, W_i)$ 158 are obtained. The volume 158 cleaned using a refinement cleaning processor 712. The refinement cleaning processor 712 preferably takes advantage of the lack of connectivity between the isolated noise voxels or noise voxel pairs and the vascular structures to differentiate the noise voxels from the vasculature. In a suitable embodiment, the mathematical morphology 713 is used in the volume refinement 712 for removing the loosely hanging noise voxels that are isolated and not connected to the vessels. The mathematical morphology method 713 is based on four fundamental gray scale mathematical operations: dilation, erosion, opening, and closing, which are defined as follows.

The gray scale dilation is defined as:

$$(f \oplus g)(x, y) = \max_{i,j}\{f(x-i, y-j) + g(i, j)\} \qquad (27)$$

where f is the image signal and g is the structuring element. Gray scale dilation has the property of enlarging geometric structures in an image. To understand gray scale dilation for medical imaging applications, it is useful to define the Umbra and Top of a surface. Defining $F \subseteq E^{N-1}$ f:F→E, then the Umbra of a function f, denoted by U[f], $U[f] \subseteq F \times E$, is defined as:

$$U[f] = \{(x,y) \in F \times E | y \leq f(x)\} \quad (28)$$

and the Top of Surface is defined as:

$$T[A](x) = \max\{y | (x,y) \in A\} \quad (29)$$

where A is a set. Thus, the gray scale dilation is defined in terms of the Umbra and Top of Surface as:

$$f \oplus k = T\{U[f] \oplus U[k]\} \quad (30).$$

The gray scale erosion is defined as:

$$(f \ominus g)(x, y) = \min_{i,j}\{f(x+i, y+j) - g(i, j)\}. \quad (31)$$

Gray scale erosion has the property of shrinking geometric structures in an image, which is explained using the Top and Umbra as:

$$f \ominus k = T\{U[f] \ominus U[k]\} \quad (32).$$

The gray scale closing is defined in terms of gray scale dilation and gray scale erosion as:

$$A \cdot B = (A \oplus B) \ominus B \quad (33)$$

where A is the image set and B is the structuring element set. The gray scale opening is defined in terms of gray scale dilation and gray scale erosion as:

$$A \cdot B = (A \oplus B) \ominus B \quad (34).$$

With continuing reference to FIG. 29, the refinement cleaned volume 714 is projected 716 using the binary vessels volume $I_{i,bin}(x,y,z, W_i)$ 158 as a mask onto a two-dimensional surface 718 that is initially set to zero (i.e., initially a blank surface 718). Through the masking process, only voxels identified by the binary vessels volume $I_{i,bin}(x, y, z, W_i)$ 158 as being part of the vasculature are projected. A suitable projection method is the conventional maximum intensity projection (MIP) that is modified by the use of the binary vessels volume $I_{i,bin}(x,y,z, W_i)$ mask 158 to select the projected voxels. Those skilled in the art will recognize that the use of the binary mask 158 has the dual benefits of increasing the projecting speed (due to the reduced number of voxels incorporated into the projection) and reducing extraneous noise (since the filtered mask 158 has substantially eliminated non-vascular noise contrast). The refinement cleaning and projecting is repeated 720 for all widths 150 with each projecting being onto the projection surface 718, so that the final surface 718 contains the two-dimensional projection. The projection 718 is then input to the display processor 118 (not shown in FIG. 29) to provide a two-dimensional angiographic projection display 120 (not shown in FIG. 29).

In an alternative projection embodiment (not illustrated herein), it is also contemplated to first combine the gray scale vessel volumes $I_i(x,y,z, W_i)$ 580 to form a composite gray scale image. This image is then refinement cleaned and projected using the final composite binary volume $I_F(x,y,z)$ 112 constructed as previously described with reference to FIG. 27 for the masking.

With reference returning to FIG. 5, the vessel segmentation process employs segmentation at a plurality of widths $W_j$ 154 that span the range from $W_{min}$ 152 to a maximum width. A maximum width can be obtained from a user input (based, for example, on anatomical knowledge of the operator), or by an automated analysis of the raw image $I_{raw}(x,y,z)$ 100. Having selected minimum 152 and maximum widths selected, the range of widths 150 is obtained by dividing the range $\{W_{min} \ldots W_{max}\}$ in to equal intervals on a linear, logarithmic, or other scale, or by other suitable division means.

Figure 30:
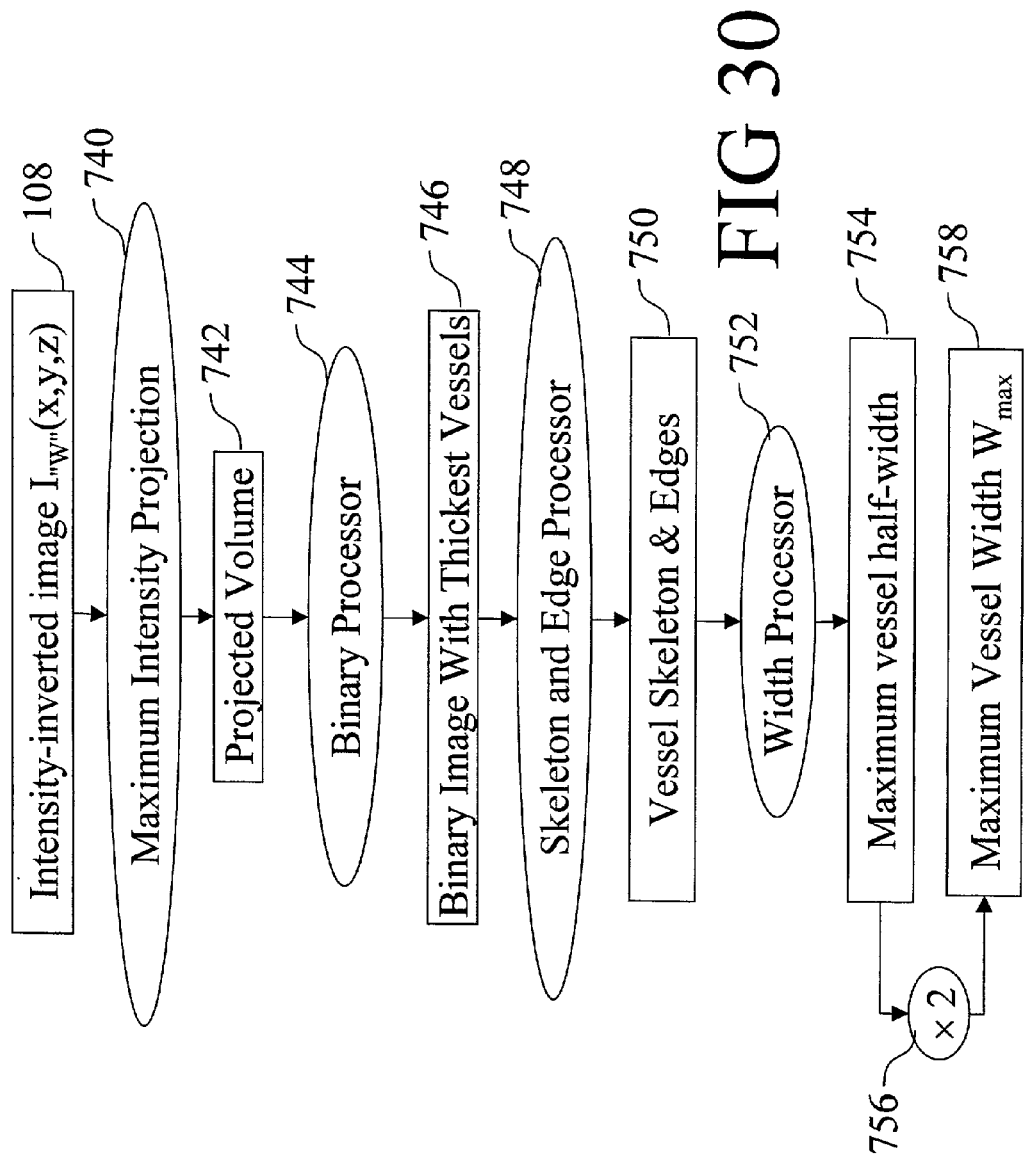
FIG. 30 shows a diagrammatic representation of a suitable embodiment for estimating the maximum vessel width in the angiographic image.

With reference to FIG. 30, a suitable embodiment of a maximum width estimator which employs an automated analysis of the intensity-inverted image $I_{\cdot,W^{\cdot\cdot}}(x,y,z)$ 108 is described. The image is projected 740 to form a two-dimensional projection image 742. A suitable projection is a maximum intensity projection (MIP). The projection 742 is thresholded by a binary processor 744 to produce a binary image 746 showing the thickest blood vessels. The statistical thresholder 600 (FIG. 25) described previously in conjunction with the binarizing of the vessel volume $I_i(x,y,z, W_i)$ 580 is also substantially suitable for the thresholding 744 of the projection 742. A skeleton-and-edge processor 748 identifies the vessel skeleton and edges 750 of the vessels in the binary image 746. The vessel edges are suitably identified using edge processors known to the art. The vessel skeleton is also suitably identified using methods known to the art, such as successive binary erosion. A width processor 752 receives the vessel skeleton and edges 750 and estimates a maximum half-width 754 by selecting the vessel having the largest minimum distance from the skeleton to the nearest edge line. Doubling 756 the half width 754 yields the maximum vessel width $W_{max}$ 758. Preferably, the process of FIG. 30 is repeated for a plurality of projecting directions to substantially ensure that the maximum blood vessel width is identified.

Figure 31B:
FIG. 31B shows a binary bone-air mask corresponding to the axial BBA image slice of FIG. 31A.
Figure 31D:
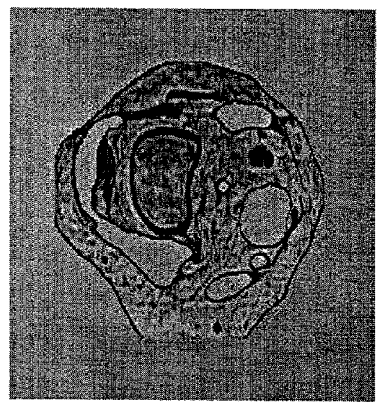
FIG. 31D shows the image of FIG. 31A with the non-vascular (bone-air) regions identified by the mask of FIG. 31B replaced by an average gray tissue intensity level.
Figure 31A:
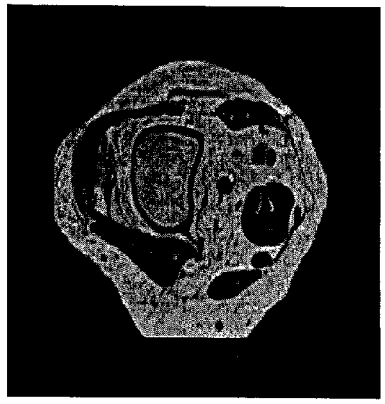
FIG. 31A shows a representative axial BBA image slice of a knee region.
Figure 31C:
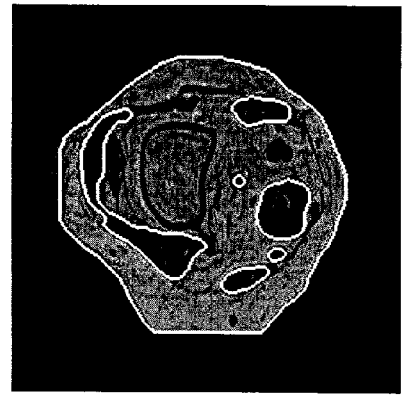
FIG. 31C shows the image of FIG. 31A with the outlines of the non-vascular (bone-air) regions identified by the mask of FIG. 31B superimposed.

The invention has been reduced to practice. FIGS. 31A–31D show an exemplary axial slice of a knee region at several stages of the segmenting processing according to the illustrated embodiment of the invention. FIG. 31A shows a reconstructed BBA image slice 770. As detailed previously with reference to the schematic image sketch of FIG. 2, the black blood magnetic resonance angiographic image 770 includes, in addition to the desired black blood vessels, a predominantly dark grey background corresponding to tissue as well as undesirable black regions corresponding to air and bone linings. FIG. 31B shows a binary bone-air mask 772 constructed for this image in accordance with the process 134. The mask 772 is black in regions corresponding to the bone and air pockets, as well as being black in the areas external to the knee, i.e. corresponding to the outside air. FIG. 31C shows a composite image 774 having the outlines of the masked 772 areas superimposed on the image 770 of FIG. 31A. The precise registry therebetween is evident. FIG. 31D shows the vessels/tissue gray scale BBA volume $I_{vt}(x,y,z)$ 776 corresponding to the volume $I_{vt}(x,y,z)$ 106 of the process of FIG. 5, in which the black bone lining and air pockets have been replaced by the mean gray tissue class intensity 322 (FIG. 13). In the image 776 of FIG. 31D, the problem of having both vascular and non-vascular black structures has been overcome because substantially only the vascular structures remain black. The image 776 is appropriate subsequent for intensity-inversion 106 and segmentation 156.

Figure 32A:
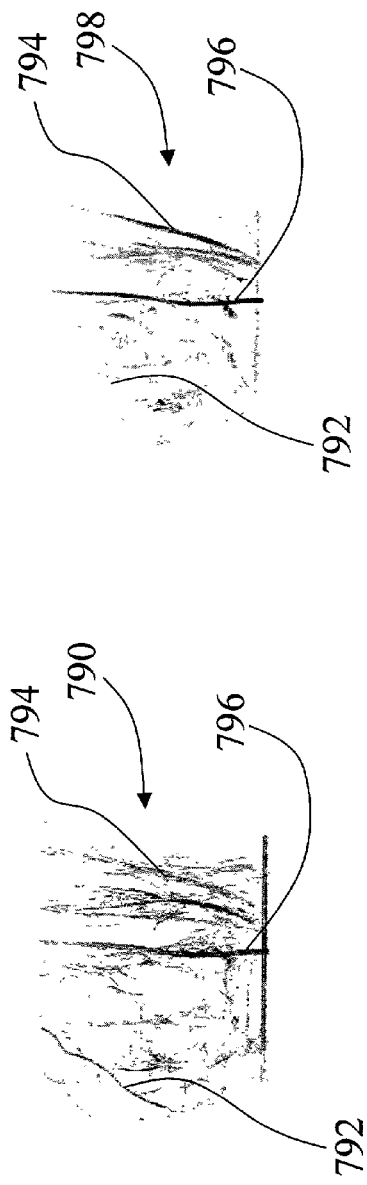
FIG. 32A shows a representative sagittal projection image of a BBA image which has been segmented in accordance with an embodiment of the invention wherein the segmentation was performed for a minimum vessel width.
Figure 32B:
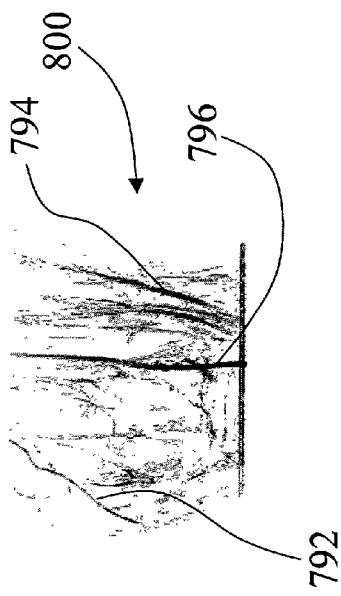
FIG. 32B shows a representative sagittal projection image of a BBA image which has been segmented in accordance with an embodiment of the invention wherein the segmentation was performed for a maximum vessel width.
Figure 32C:
FIG. 32C shows a composite projection image which combines the images of FIGS. 32A and 32B.

FIGS. 32A–32D show exemplary segmented BBA sagittal projection images of a knee. FIG. 32A shows an image 790 in which the segmentation has been performed using a small width $W_i$ 154. The image 790 corresponds to the vessels volume $I_i(x,y,z, W_i)$ 580 of FIG. 15 for a small value of $W_i$ 154. The image 790 accurately and sharply reflects a high density of narrow blood vessels such as the vessel 792, but larger, thicker vessels 794, 796 are blurry or indistinct. FIG. 32B shows an image 798 in which the segmentation has been performed using a large width $W_i$ 154. The image 798 corresponds to the vessels volume $I_i(x,y,z, W_i)$ 580 of FIG. 15 for a large value of $W_i$ 154. The image 798 clearly and sharply shows the large, thick vessels 794, 796 but does not show, or shows in a very blurry manner, most of the small vessels. FIG. 32C shows a composite image 800 which combines the images 790, 798 in substantially accordance with the method described with reference to FIG. 29. The combined image 800 clearly and distinctly shows both the narrow blood vessels 792 and the thick vessels 794, 796. It will be appreciated that the image 800 has substantially suppressed non-vascular features such as the knee joint bone ends, air pockets, and the like, while retaining the angiographic vascular structures.

FIGS. 33A–33D show exemplary segmented BBA sagittal projection images of a knee. FIG. 33A shows an image 810 in which the segmentation has been performed using a small width $W_i$ 154. The image 810 corresponds to the vessels volume $I_i(x,y,z, W_i)$ 580 of FIG. 15 for a small value of $W_i$ 154. The image 810 accurately and sharply reflects a high density of narrow blood vessels such as the vessels 812, but larger, thicker vessels such as the vessel 814 are blurry or indistinct. FIG. 33B shows an image 820 in which the segmentation has been performed using a large width $W_i$ 154. The image 820 corresponds to the vessels volume $I_i(x,y,z, W_i)$ 580 of FIG. 15 for a large value of $W_i$ 154. The image 820 clearly and sharply shows the large, thick vessel 814 and additionally shows another large, thick vessel 822 which did not appear at all in the image 810. However, the image 820 shows the narrow vessels such as the vessels 812 blurrily, and omits portions of these vessels. FIG. 33C shows a composite image 830 which combines the images 810, 820 in substantially accordance with the method described with reference to FIG. 29. The combined image 830 clearly and distinctly shows both the narrow blood vessels 812 and the thick vessels 814, 822. It will be appreciated that the image 830 has substantially suppressed non-vascular features such as the knee joint bone ends, air pockets, and the like, while retaining the angiographic vascular structures.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A processor programmed to perform a method for processing a three-dimensional black blood angiographic image comprised of voxels, each having an intensity value, the image including both vascular and non-vascular structures or regions, the method performed by the processor comprising:
   assigning each voxel a class corresponding to one of a vessel/air/bone voxel class and a tissue voxel class;
   averaging the intensity values of the voxels assigned to the tissue voxel class to obtain an average intensity value;
   identifying structures comprised of voxels assigned to the vessel/air/bone voxel class which comply with at least one of selected size and shape characteristics; and
   replacing the voxels corresponding to the identified structures with the average intensity value.

2. The processor as set forth in claim 1, wherein the method performed by the processor further includes:
   intensity-inverting the intensity values.

3. The processor as set forth in claim 1, wherein the method performed by the processor further includes:
   obtaining second order directional derivatives of the image; and
   assigning each voxel to one of a vascular type and a non-vascular type based on the second order derivatives.

4. A method for processing a three-dimensional black blood angiographic image comprised of voxels, each having an intensity value, the image including both vascular and non-vascular structures or regions, the method comprising:
   intensity-inverting the voxel intensities;
   assigning each intensity-inverted voxel a class corresponding to one of a vessel/air/bone voxel class and a tissue voxel class;
   averaging the intensity values of the intensity-inverted voxels assigned to the tissue voxel class to obtain an average intensity value;
   identifying structures comprised of intensity-inverted voxels assigned to the vessel/air/bone voxel class which comply with at least one of selected size and shape characteristics; and
   replacing the voxels corresponding to the identified structures with the average intensity value to generate an intensity-inverted image for segmenting; and
   segmenting the intensity-inverted image to identify the vasculature.

5. The method as set forth in claim 4, wherein the segmenting includes at least one of:
   identifying the vasculature as a set of voxels corresponding to the imaged vascular structures;
   separating of the vascular regions of the image from the non-vascular regions of the image;
   assigning a first value to voxels corresponding to imaged vascular structures, and a second value to voxels corresponding to imaged non-vascular structures; and
   removing contrast corresponding to non-vascular structures from the image.

6. The method as set forth in claim 4, wherein the segmenting includes:
   convolving the intensity-inverted image with a second order derivative of a Gaussian using a separable computation mode.

7. The method as set forth in claim 6, wherein the convolving of the image with a second order derivative of a Gaussian using a separable computation mode includes:
   generating a padded one-dimensional image vector based on the image;
   generating a one-dimensional second order Gaussian derivative vector corresponding to the second order derivative of the Gaussian; and
   one-dimensionally convolving the padded one-dimensional image vector with the one dimensional second order Gaussian derivative vector, said convolving comprising element-by-element multiplication, shifting, and adding of the components of the one-dimensional vectors.

8. The method as set forth in claim 4, wherein the segmenting includes:
   forming a Hessian matrix corresponding to a first voxel;
   obtaining eigenvalues of the Hessian matrix;
   generating a gray scale voxel intensity functionally dependent upon the eigenvalues; and
   repeating the forming of a Hessian matrix, the obtaining of eigenvalues, and the generating of a gray scale voxel intensity for each voxel to generate a gray scale segmented image.

9. The method as set forth in claim 8, wherein the generating of a gray scale voxel intensity functionally dependent upon the eigenvalues includes at least one of:
   computing a blobbiness term indicative of the fatness of the structure containing the voxel;

computing an in-plane or plane/line term indicative of a ratio of the largest area of cross-section to the largest axis of this cross-section of the structure containing the voxel; and computing a hangness term indicative of the voxel connectivity or brightness.

10. The method as set forth in claim 4, wherein the segmenting includes:

filtering the intensity-inverted image to produce a segmented image with substantially suppressed intensities for voxels corresponding to non-vascular structures; and binarizing the segmented image to produce a binarized image wherein vascular regions are represented by voxels having a first binary value and non-vascular regions are represented by voxels having a second binary value.

11. The method as set forth in claim 10, further including:
projecting voxels of the segmented image which have the first binary value to form a projected image.

12. The method as set forth in claim 11, further including:
prior to the projecting, removing noise voxels from the segmented image based on at least one of voxel connectivity and mathematical morphology.

13. The method as set forth in claim 11, further including:
causing isolated or disconnected voxels having the first binary value by to assume the second binary value.

14. The method as set forth in claim 4, wherein the segmenting includes:

defining a plurality of widths;

generating a plurality of segmented images from the intensity inverted image, each segmented image being associated with one of the plurality of widths and each segmented image selectively enhancing vascular contrast for vascular regions with cross-sections corresponding to the associated width; and binarizing each segmented image to produce a binarized image selectively identifying vascular regions with cross-sections corresponding to the associated width.

15. The method as set forth in claim 14, wherein the binarizing of each segmented image includes:

calculating a threshold based on statistical analysis of the voxel intensities of the segmented image;

adjusting the threshold based on the associated width; and applying the adjusted threshold to binarize the segmented image.

16. The processor as set forth in claim 1, wherein the method performed by the processor further includes:
resizing the image using a wavelet transform.

17. The processor as set forth in claim 1, wherein the assigning to each voxel of a classification corresponding to one of a vessel/air/bone voxel class and a tissue voxel class includes:

iteratively calculating for each voxel a statistical probability that the voxel corresponds to the vessel/air/bone voxel class or the tissue voxel class; and assigning to each voxel a class based on the calculated probability.

18. The processor as set forth in claim 1, wherein the identifying of structures comprised of voxels assigned to the vessel/air/bone voxel class which comply with at least one of selected size and shape characteristics includes:

generating a binary mask in which the voxels assigned to the vessel/air/bone voxel class are assigned a first value and the voxels assigned to the tissue voxel class are assigned a second value;

mathematically reducing a volume of regions of the mask in which the voxels have the first value by a preselected amount; and mathematically enlarging a volume of the mask regions in which the voxels have the first value by the preselected amount.

19. A processor programmed to perform a method for processing a black blood angiographic image having an intermediate intensity background with low intensity structures corresponding to vascular and non-vascular structures imaged thereon, the method performed by the processor comprising:

identifying an average background intensity for the intermediate intensity background;

identifying at least one low intensity non-vascular structure;

replacing the intensity of the at least one low intensity non-vascular structure with the average background intensity to generate a vessels image; and processing the vessels image to separate the vascular structures from the intermediate intensity background.

20. The processor as set forth in claim 19, wherein the identifying of at least one low intensity non-vascular structure includes:

forming a mask corresponding to the low intensity structures; and identifying and removing vascular structures from the mask based on the size of the structures.

21. The processor as set forth in claim 19, wherein the method performed by the processor further includes:

reversing the vessels image intensity polarity to produce a reverse-polarity image having high intensity vascular structures.

22. A method of diagnostic imaging comprising:

applying a non-uniform magnetic field to the subject;

transmitting a radio frequency signal into the subject;

measuring radio frequency signals emitted by the subject;

reconstructing the measured radio frequency signals to generate a black blood angiographic image representation in which image elements corresponding to a first class are in a first characteristic value range and elements corresponding to a second class are in a second characteristic value range;

identifying structures comprised of image elements corresponding to at least one member of the first class by at least one of shape and size characteristics; and changing the image elements of the identified structures from the first characteristic value range to the second characteristic value range.

23. The method as set forth in claim 22 wherein the first class includes blood, bone, and air and the at least one member of the first class includes at least one of bone and air.

24. The post-acquisition method as set forth in claim 23 wherein the second class includes tissue, the method further including:

averaging intensity values of the image elements of the tissue class to obtain an average intensity value, and in the changing step, replacing the image elements corresponding to the identified structures with the tissue class average intensity value.

25. The method as set forth in claim 22 wherein the first characteristic value range includes black and dark gray and the second characteristic value range includes lighter gray.

26. The method as set forth in claim 25, further including:

setting all values in the first characteristic value range to black and all values in the second characteristic value range to white to generate a black blood angiographic image representation.

27. A processor programmed to perform a method of diagnostic imaging, the method performed by the processor comprising:
identifying elements in first and second classes by:
constructing an intensity histogram of values of the image elements,
with a parameterized statistical model, assigning to each image element a first probability that the image element belongs in the first class and a second probability that the image element belongs in the second class, and
iteratively optimizing the parameters of the statistical model to optimize class probabilities for the image elements
generating a diagnostic image representation in which image elements corresponding to the first class are in a first characteristic value range and elements corresponding to the second class are in a second characteristic value range; and
identifying structures comprised of image elements corresponding to at least one member of the first class by at least one of shape and size characteristics.

28. The processor as set forth in claim 27, wherein the parameterized statistical model is a Gaussian statistical model having parameters corresponding to the Gaussian mean and the Gaussian variance or standard deviation.

29. The processor as set forth in claim 28, wherein the assigning to each image element includes:
constructing weighted class likelihood probabilities corresponding to the first class and the second class for each image element using the Gaussian model.

30. An apparatus for producing a black blood angiographic image representation of a subject, the apparatus comprising:
an imaging scanner that acquires imaging data from at least a portion of a subject, wherein the imaging data includes black blood vascular contrast effectuated by at least one of an associated contrast agent administered to the subject and an operative imaging modality of the imaging scanner;
a reconstruction processor that reconstructs an image representation from the imaging data, the image representation comprising a plurality of gray scale image elements, and the image representation exhibiting black blood vascular contrast; and
a post-acquisition processor that:
transforms the image representation into a pre-processed image representation,
assigns each image element into one of a plurality of classes including a black class corresponding at least to imaged vascular structures and a gray class corresponding to at least some non-vascular tissues,
averages intensities of the image elements of the gray class to obtain a mean gray intensity value, and
replaces the values of image elements comprising non-vascular structures of the black class with the mean gray intensity value.

31. The apparatus as set forth in claim 30, wherein the transforming of the image representation into a pre-processed image includes at least one of:
smoothing the image representation, and
re-sizing the image representation by a pre-selected fraction using a lumen edge-preserving wavelet transform.

32. The apparatus as set forth in claim 30, wherein the imaging scanner includes one of a magnetic resonance imaging scanner and a computed tomography scanner.

33. The apparatus as set forth in claim 30, wherein the post acquisition processor further:
reverses the image contrast so that image elements of the black class have high relative intensities.

34. The apparatus as set forth in claim 33, wherein the post acquisition processor further:
differentiates imaged vascular structures from imaged non-vascular structures in the reversed contrast image to extract vascular information.

35. A method for analyzing black blood angiographic gray scale data, the method comprising:
identifying a black blood intensity range corresponding to vasculature and non-vascular structures;
identifying a gray intensity corresponding to at least some non-vascular tissue; and
replacing non-vascular structures having intensities in the black blood intensity range with the gray intensity to generate a vessels image in which the black blood intensity range corresponds to vasculature.

36. The method as set forth in claim 35, further including:
intensity inverting the vessels image to create an intensity-reversed image;
identifying a plurality of width ranges between a minimum width and a maximum width inclusive; and
segmenting the intensity-reversed image a plurality of times to generate a plurality of vessel images corresponding to the plurality of width ranges, each vessel image preferentially imaging vessels within the corresponding width range.

37. The method as set forth in claim 36, further comprising selecting the maximum width by:
projecting the intensity-reversed image to create an image projection;
binarizing the image projection;
finding the vessel edges in the image projection;
identifying a vessel skeleton in the image projection;
comparing the vessel edges with the vessel skeleton to obtain a maximum vessel half-width; and
doubling the maximum vessel half-width to obtain the maximum width.

38. A diagnostic imaging apparatus comprising:
means for generating a black blood angiographic image representation in which image elements corresponding to a first class are in a first characteristic value range and image elements corresponding to a second class are in a second characteristic value range;
means for identifying at least one image structure formed of image elements of the first class by at least one of shape and size characteristics of the at least one image structure;
means for changing the image elements forming the at least one image structure from the first value range to the second value range to generate a vessels-tissue image;
means for intensity inverting the vessels-tissue image to create an intensity-reversed image;
means for identifying a plurality of width ranges between a minimum width and a maximum width inclusive; and
means for segmenting the intensity-reversed image a plurality of times to generate a plurality of vessel images corresponding to the plurality of width ranges, each vessel image preferentially imaging vessels within the corresponding width range.

* * * * *